United States Patent
Hwang et al.

(10) Patent No.: US 11,296,102 B2
(45) Date of Patent: Apr. 5, 2022

(54) THREE-DIMENSIONAL SEMICONDUCTOR MEMORY DEVICE

(71) Applicant: Samsung Electronics Co., Ltd., Suwon-si (KR)

(72) Inventors: Sung-Min Hwang, Hwaseong-si (KR); Woosung Yang, Gwangmyeong-si (KR); Joon-Sung Lim, Seongnam-si (KR); Jiyoung Kim, Yongin-si (KR); Jiwon Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/858,983

(22) Filed: Apr. 27, 2020

(65) Prior Publication Data

US 2021/0098478 A1 Apr. 1, 2021

(30) Foreign Application Priority Data

Sep. 26, 2019 (KR) .......................... 10-2019-0119075

(51) Int. Cl.
*H01L 27/11556* (2017.01)
*H01L 27/11582* (2017.01)
(Continued)

(52) U.S. Cl.
CPC ........ *H01L 27/11556* (2013.01); *G11C 5/025* (2013.01); *G11C 5/06* (2013.01); *H01L 23/528* (2013.01); *H01L 27/11582* (2013.01)

(58) Field of Classification Search
CPC ......... H01L 27/11556; H01L 27/11582; H01L 27/11575; H01L 27/11524; H01L 27/1157;
(Continued)

(56) References Cited

U.S. PATENT DOCUMENTS 8,704,288 B2 4/2014 Lee et al.
8,994,099 B2 3/2015 Lee et al.
(Continued)

FOREIGN PATENT DOCUMENTS

KR 10-2015-0051841 A 5/2015

*Primary Examiner* — Galina G Yushina
(74) *Attorney, Agent, or Firm* — Harness, Dickey & Pierce, P.L.C.

(57) ABSTRACT

Disclosed is a three-dimensional semiconductor memory device including a substrate including a cell array region and a connection region, a stack including first and second stacks sequentially stacked on the substrate, the stack having a staircase structure on the connection region, each of the first and second stacks including conductive patterns vertically stacked on the substrate, and contact plugs disposed on the connection region and respectively coupled to the conductive patterns. A bottom surface of each contact plug is located between top and bottom surfaces of a corresponding conductive pattern. In each stack, a recess depth of each contact plug varies monotonically in a stacking direction of the conductive patterns, when measured from a top surface of a corresponding conductive pattern. The contact plugs coupled to an uppermost conductive pattern of the first stack and a lowermost conductive pattern of the second stack have discrete recess depths.

20 Claims, 32 Drawing Sheets

(51) Int. Cl.
*H01L 23/528* (2006.01)
*G11C 5/06* (2006.01)
*G11C 5/02* (2006.01)

(58) Field of Classification Search
CPC ........... H01L 27/11578; H01L 27/0207; H01L 23/528; H01L 23/481; H01L 21/76805; H01L 21/76816; H01L 29/792; H01L 29/66833; G11C 5/05; G11C 5/025
See application file for complete search history.

(56) References Cited

U.S. PATENT DOCUMENTS

| | | | |
|---|---|---|---|
| 9,412,753 B2 | 8/2016 | Izumi et al. | |
| 9,633,945 B1 | 4/2017 | Mizutani | |
| 9,711,603 B2 * | 7/2017 | Lim | H01L 27/11575 |
| 2015/0179660 A1 * | 6/2015 | Yada | H01L 21/02164 |
| | | | 257/321 |
| 2015/0214103 A1 | 7/2015 | Matsuda | |
| 2017/0077026 A1 * | 3/2017 | Okawa | H01L 23/528 |
| 2017/0117222 A1 * | 4/2017 | Kim | H01L 21/76829 |
| 2020/0144380 A1 | 5/2020 | Hwang et al. | |

\* cited by examiner

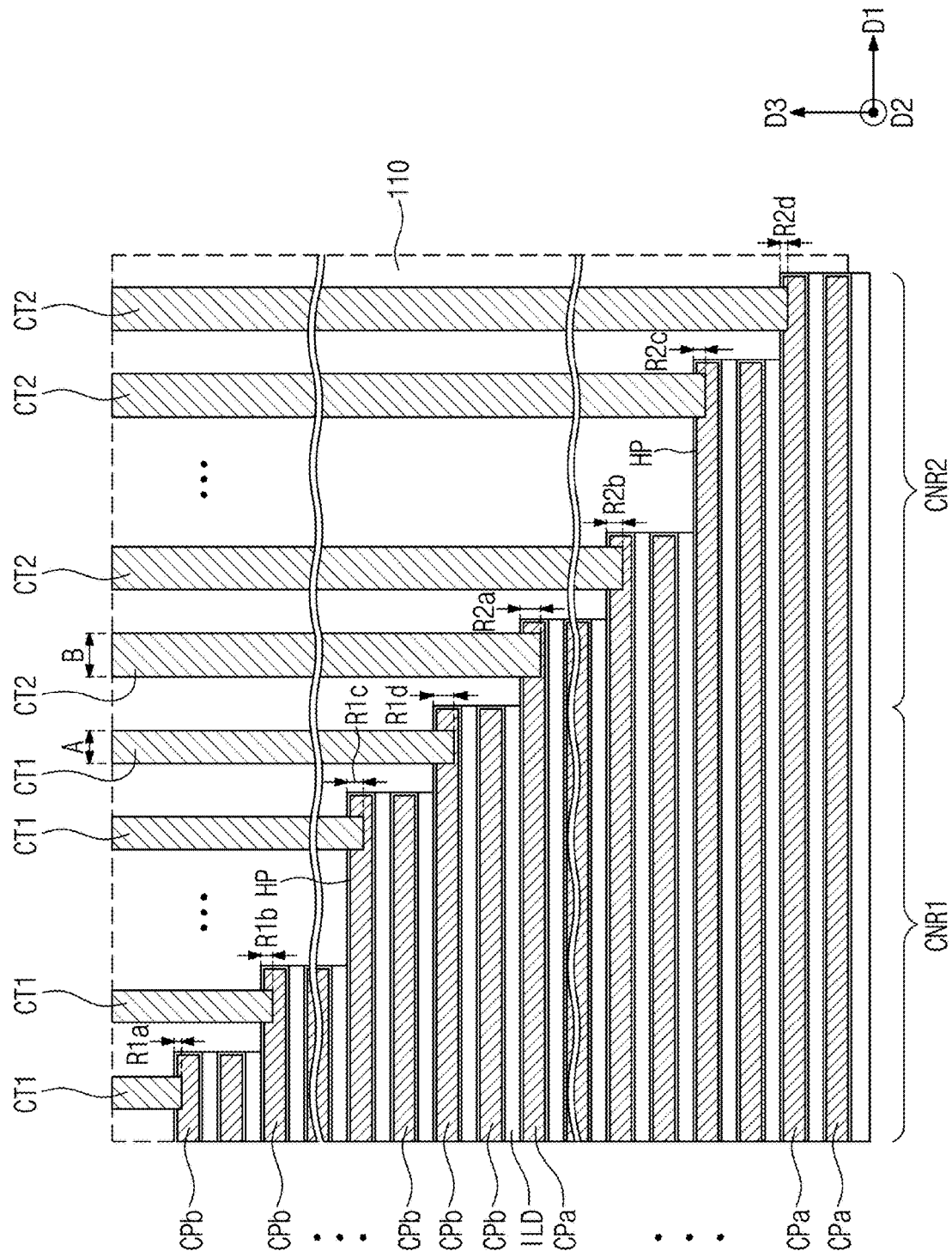

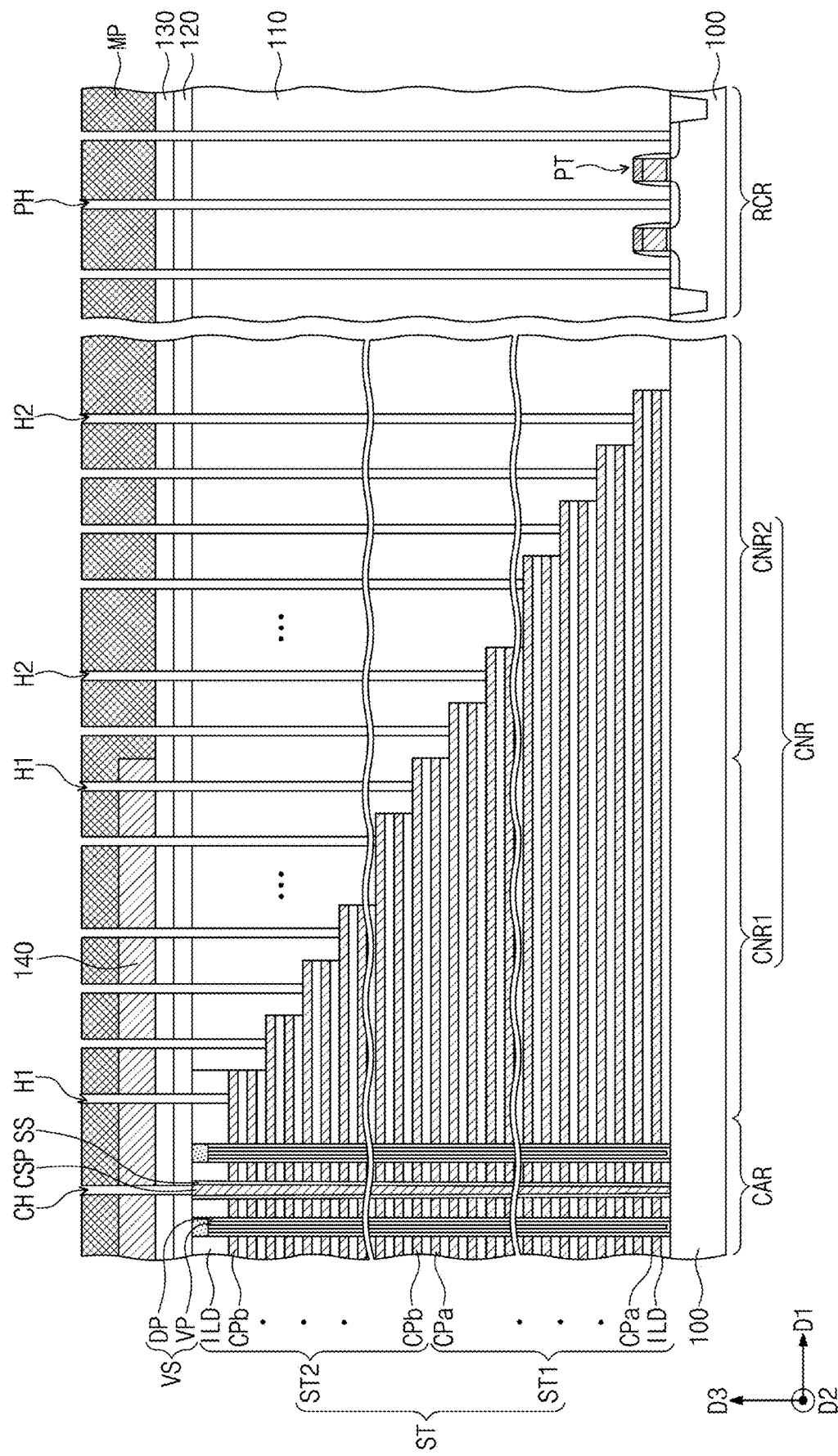

THREE-DIMENSIONAL SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2019-0119075, filed on Sep. 26, 2019, in the Korean Intellectual Property Office, the entire contents of which are hereby incorporated by reference.

BACKGROUND

Inventive concepts relate to a three-dimensional semiconductor memory device, and in particular, to a three-dimensional semiconductor memory device with high reliability and a high integration density.

Higher integration of semiconductor devices is required/desired to satisfy consumer demands for superior performance and/or inexpensive prices. In the case of semiconductor devices, since their integration is an important factor in determining product prices, increased integration is especially required/desired. Thus, three-dimensional semiconductor memory devices including three-dimensionally arranged memory cells have recently been proposed.

SUMMARY

Some example embodiments of inventive concepts provide a three-dimensional semiconductor memory device with improved reliability.

According to some example embodiments of inventive concepts, a three-dimensional semiconductor memory device may include a substrate including a cell array region and a connection region, a stack including a first stack and a second stack, the first stack and the second stack sequentially stacked on the substrate, the stack having a staircase structure on the connection region, a number of steps of the staircase decreasing in a first direction, each of the first and second stacks comprising conductive patterns vertically stacked on the substrate, and contact plugs on the connection region and respectively coupled to the conductive patterns of the first and second stacks. A bottom surface of each of the contact plugs is between top and bottom surfaces of a corresponding one of the conductive patterns. In the first stack, recess depths of neighboring ones of the contact plugs varies monotonically in the first direction, the recess depths measured from a top surface of a corresponding one of the conductive patterns. In the second stack, recess depths of neighboring ones of the contact plugs varies monotonically in the first direction, the recess depths measured from a top surface of a corresponding one of the conductive patterns. Recess depths vary to have an inflection between contacts neighboring one another in the first and second stack.

According to some example embodiments of inventive concepts, a three-dimensional semiconductor memory device may include a substrate including a cell array region and a connection region, a stack including a first stack and a second stack sequentially stacked on the substrate, the stack having a staircase structure on the connection region, each of the first and second stacks comprising insulating patterns and conductive patterns, which are vertically and alternately stacked on the substrate, a planarization insulating layer covering the staircase structure of the stack and having a substantially flat top surface, portions of the insulating patterns being in direct contact with the planarization insulating layer, first contact plugs, which are on the connection region and penetrate the planarization insulating layer and are respectively coupled to the conductive patterns of the first stack, and second contact plugs, which are on the connection region and are respectively coupled to the conductive patterns of the second stack. A bottom surface of each of the first and second contact plugs is located between top and bottom surfaces of a corresponding one of the conductive patterns. A recess depth of each of the first contact plugs varies monotonically in a stacking direction of the conductive patterns, the recess depth measured from a top surface of a corresponding one of the conductive patterns of the first stack. A recess depth of each of the second contact plugs varies monotonically in a stacking direction of the conductive patterns, the recess depth measured from a top surface of a corresponding one of the conductive patterns of the second stack. Recess depths of adjacent ones of the first and second contact plugs vary to have an inflection, the recess depths of adjacent ones of the first and second contact plugs measured from a top surface of a corresponding one of the conductive patterns.

According to some example embodiments of inventive concepts, a three-dimensional semiconductor memory device may include a substrate including a cell array region and a connection region, a stack including first, second, and third stacks sequentially stacked on the substrate, the stack having a staircase structure on the connection region, each of the first, second, and third stacks comprising insulating patterns and conductive patterns vertically and alternately stacked on the substrate, and contact plugs coupled to the conductive patterns of the stack, respectively. A bottom surface of each of the contact plugs is between top and bottom surfaces of a corresponding one of the conductive patterns. The contact plugs comprise a first contact plug coupled to an uppermost conductive pattern of the first stack, a second contact plug coupled to a lowermost conductive pattern of the first stack, a third contact plug coupled to an uppermost conductive pattern of the second stack, a fourth contact plug coupled to a lowermost conductive pattern of the second stack, a fifth contact plug coupled to an uppermost conductive pattern of the third stack, and a sixth contact plug coupled to a lowermost conductive pattern of the third stack. A difference between recess depths of the bottom surfaces of the third and fourth contact plugs is less than a difference between recess depths of the bottom surfaces of the first and second contact plugs or between recess depths of the bottom surfaces of the fifth and sixth contact plugs, where each of the recess depths is measured from a top surface of a corresponding one of the conductive patterns. The recess depths of the bottom surfaces of the contact plugs may be between 0.1 to 0.9 times a thickness of a corresponding one of the conductive patterns.

According to some example embodiments of inventive concepts, a three-dimensional semiconductor memory device may include a substrate including a cell array region and a connection region, a stack including a first stack and a second stack sequentially stacked on the substrate, the stack having a staircase structure on the connection region, each of the first and second stacks comprising insulating patterns and conductive patterns vertically and alternately stacked on the substrate, and contact plugs coupled to the conductive patterns of the stack, respectively. A bottom surface of each of the contact plugs is between top and bottom surfaces of a corresponding one of the conductive patterns, each of the contact plugs has a recess depth defined by a difference between a top surface of the conductive pattern and a bottom surface of the contact plug, the contact plugs comprise, a first contact plug coupled to an uppermost conductive pattern of the first stack, a second contact plug coupled to a lowermost conductive pattern of the first stack, a third contact plug coupled to an uppermost conductive pattern of the second stack, and a fourth contact plug coupled to a lowermost conductive pattern of the second stack. A difference between the recess depths of adjacent ones of the contact plugs which are between the first and second contact plugs is less than a difference between the recess depths of adjacent ones of the contact plugs which are between the third and fourth contact plugs.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 2A and 2B are sectional views illustrating a portion of a connection region of a three-dimensional semiconductor memory device fabricated by the fabrication method of FIGS. 1A to 1G.

FIGS. 15 and 16 are sectional views illustrating a method of fabricating three-dimensional semiconductor memory devices according to some embodiments of inventive concepts.

It should be noted that these figures are intended to illustrate the general characteristics of methods, structure and/or materials utilized in certain example embodiments and to supplement the written description provided below. These drawings are not or may not be, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which example embodiments are shown.

FIGS. 1A to 1G are sectional views illustrating a method of fabricating a three-dimensional semiconductor memory device according to some example embodiments of inventive concepts.

Figure 1A:
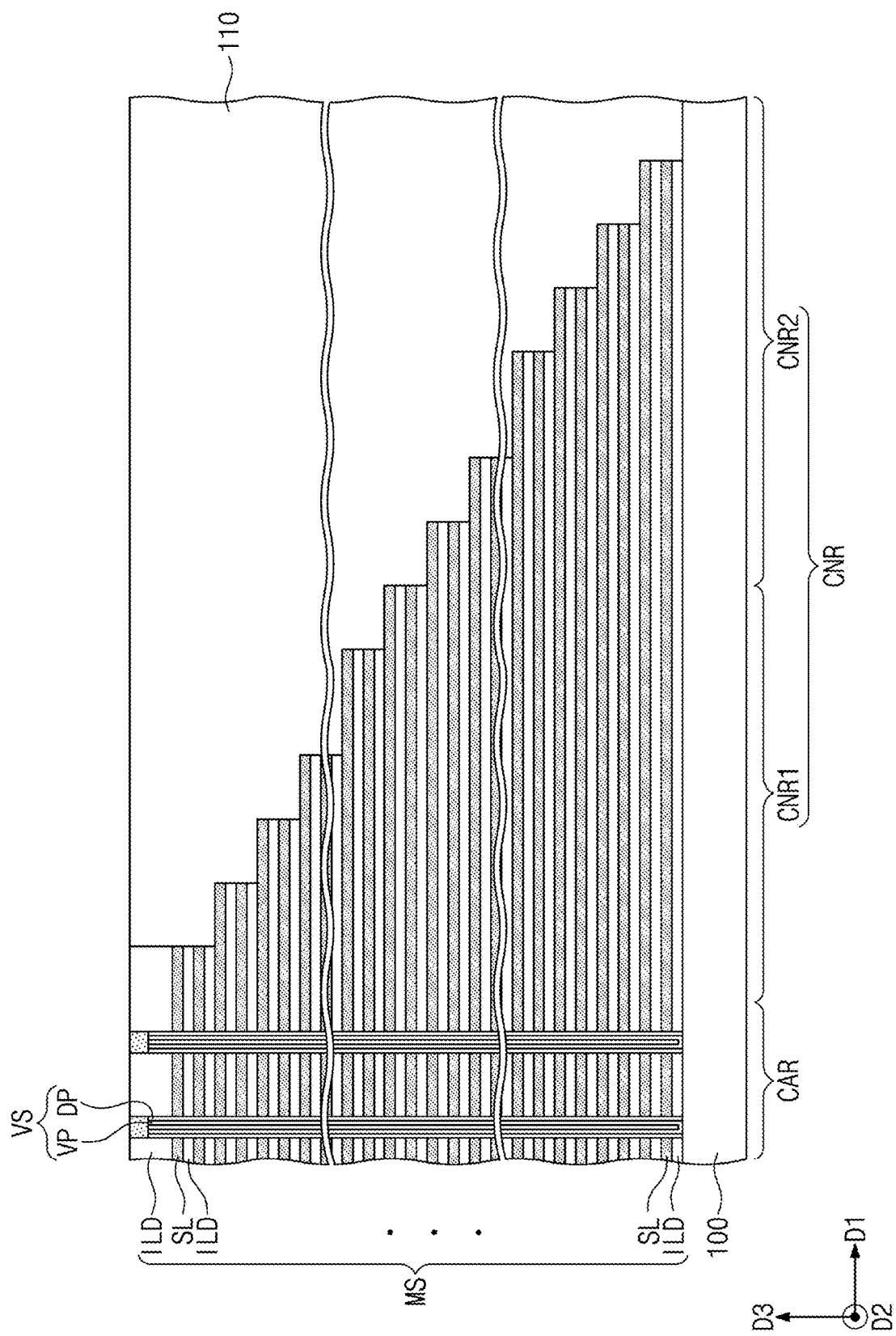
FIGS. 1A to 1G are sectional views illustrating a method of fabricating a three-dimensional semiconductor memory device according to some example embodiments of inventive concepts.

Referring to FIG. 1A, a substrate 100 including a cell array region CAR and a connection region CNR may be provided. The connection region CNR may include an upper connection region CNR1 and a lower connection region CNR2, and the upper connection region CNR1 may be adjacent to the cell array region CAR.

A mold structure MS may be formed on the substrate 100, and the mold structure MS may include sacrificial layers SL and insulating layers ILD, which are vertically and alternately stacked on the substrate 100. The mold structure MS may be deposited, e.g. may be deposited with a chemical vapor deposition (CVD) process and/or an atomic layer deposition (ALD) process. The sacrificial layers SL and the insulating layers ILD may be formed alternately and repeatedly in one CVD chamber, or, alternatively, in multiple CVD chambers. Here, the sacrificial layers SL may be formed of a material, which can be etched with high etch selectivity with respect to the insulating layers ILD. For example, the sacrificial layers SL may be formed of or include, or consist of, silicon nitride, and the insulating layers ILD may be formed of or include, or consist of silicon oxide. In some example embodiments, the sacrificial layers SL may be formed of or include, or consist of a conductive material, and in this case, a subsequent replacement process may be omitted.

The mold structure MS may have a staircase structure on the connection region CNR. The formation of the mold structure MS may include vertically and alternately stacking the sacrificial layers SL and the insulating layers ILD on the substrate 100 to form a layered structure (not shown) and then performing a staircase patterning process on the layered structure. The staircase patterning process may include a single photolithographic patterning process, or, alternatively, may include a plurality of photolithographic patterning processes. The staircase patterning process may be performed to form the staircase structure in the mold structure MS and on the connection region CNR, when viewed in a sectional view taken along a first direction D1. In the staircase patterning process, a slope of the staircase structure viewed in the sectional view taken along the first direction D1 may vary, depending on the number of the sacrificial layers SL which are etched during a process of etching a portion of the layered structure. In the case where two or more sacrificial layers SL are etched when a portion of the layered structure is etched, such a staircase structure may also be formed in a second direction D2.

After the formation of the mold structure MS, a planarization insulating layer 110 may be formed to cover the staircase structure of the mold structure MS. The planarization insulating layer 110 may be deposited with a CVD process, and may be planarized with a chemical mechanical planarization process and/or with an etchback process; however, example embodiments are not limited thereto. The planarization insulating layer 110 may have a flat top surface, which is located at substantially the same level as a top surface of the mold structure MS. The planarization insulating layer 110 may be formed by forming an insulating gapfill layer to be thicker than the mold structure MS and then performing a planarization process on the insulating gapfill layer.

After the formation of the planarization insulating layer 110, vertical structures VS may be formed to penetrate the mold structure MS. The vertical structures VS may be formed on the cell array region CAR as well as the connection region CNR, and in this case, the vertical structures VS on the connection region CNR may be formed to penetrate the planarization insulating layer 110 and the mold structure MS.

The formation of the vertical structures VS may include forming vertical holes to penetrate the mold structure MS and to expose the substrate 100, and then forming a vertical insulating pattern DP and a vertical semiconductor pattern VP in each of the vertical holes.

The vertical insulating pattern DP may be formed to enclose a sidewall of the vertical semiconductor pattern VP. The vertical insulating pattern DP may be formed with a CVD process and/or with an ALD process. The vertical insulating pattern DP may include one layer or a plurality of layers. The vertical insulating pattern DP may be a part of a data storing layer. As an example, the vertical insulating pattern DP may be a data storing layer of a NAND FLASH memory device and may include a tunnel insulating layer, a charge storing layer, and a blocking insulating layer; however, example embodiments are not limited thereto.

The vertical semiconductor pattern VP may be in contact with, e.g. in direct contact with, the substrate 100 and may have a section shaped like a cylindrical pipe with a closed bottom end, or a letter 'U'. An internal space of the vertical semiconductor patterns VP may be filled with an insulating material and/or air, e.g. clean, dry air (CDA). The vertical semiconductor patterns VP may be formed of or include at least one of semiconductor materials, such as silicon (Si), germanium (Ge), or mixtures thereof.

Figure 1B:
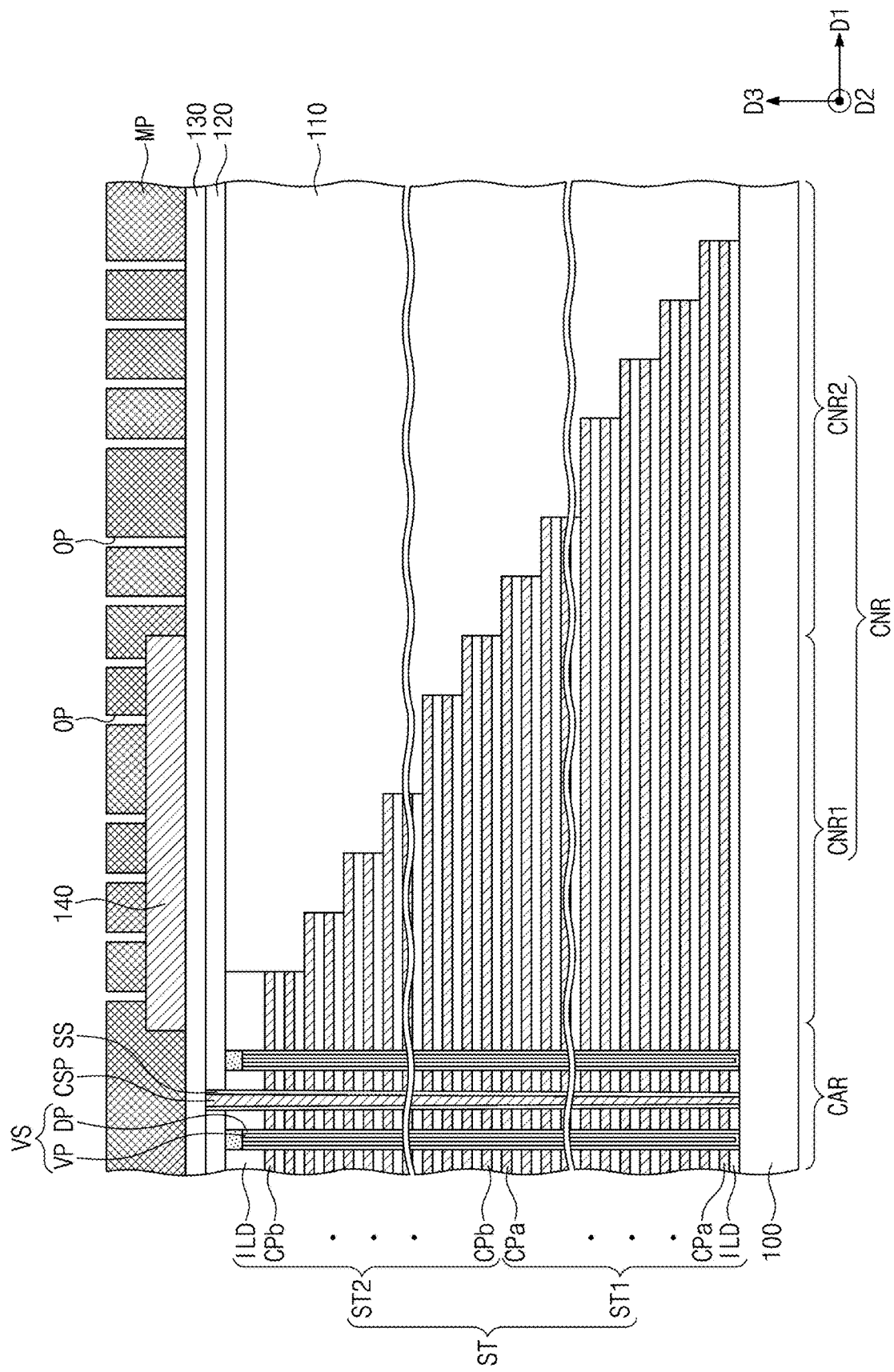

Referring to FIG. 1B, a first interlayered insulating layer 120 may be formed on the mold structure MS and the planarization insulating layer 110. Thereafter, a replacement process may be performed to replace the sacrificial layers SL with conductive patterns CPa and CPb.

The replacement process may include forming trenches to penetrate the first interlayered insulating layer 120 and the mold structure MS and to expose the substrate 100, removing the sacrificial layers SL exposed through the trenches to form gate regions between the insulating patterns ILD, and forming the conductive patterns CPa and CPb in each of the gate regions. Here, the formation of the gate regions may include isotropically etching the sacrificial layers SL using an etch recipe, such as a wet process etch recipe, having an etch selectivity with respect to the planarization insulating layer 110, the insulating patterns ILD, the vertical structures VS, and the substrate 100. For example, the sacrificial layers SL may have an etch selectivity such that the sacrificial layers SL are etched faster in the presence of a wet chemical than any of the planarization insulating layer 110, the insulating patterns ILD, the vertical structures VS, and the substrate 100. The conductive patterns CPa and CPb may be formed of or include at least one of metal nitrides (e.g., TiN, TaN, and/or WN) or metals (e.g., W, Al, Ti, Ta, Co, and/or Cu). Furthermore, a horizontal insulating pattern HP (see, e.g., FIGS. 2A and 2B) may be formed to conformally cover an inner surface of each gate region, before forming the conductive patterns CPa and CPb in the gate regions. The horizontal insulating pattern HP may be a part of the data storing layer of the NAND FLASH memory device.

As a result of the replacement process, a stack ST including the conductive patterns CPa and CPb and the insulating patterns ILD, which are vertically and alternately stacked on the substrate 100, may be formed on the substrate 100. In some example embodiments, the stack ST may include a lower stack ST1 including conductive patterns CPa, whose end portions are located on the lower connection region CNR2, and an upper stack ST2 including conductive patterns CPb, whose end portions are located on the upper connection region CNR1.

After the formation of the stack ST, impurity regions (not shown) may be formed by doping portions of the substrate 100, which are exposed through the trenches, with impurities. The impurity regions may be formed with an ion implantation process, such as a beamline implantation process and/or a plasma assisted doping process. Thereafter, an insulating spacer SS may be formed in the trench to cover side surfaces of the conductive patterns CPa and CPb, and a common source conductive pattern CSP, which is coupled to the impurity region or the substrate 100, may be formed in the trench.

After the formation of the common source conductive pattern CSP, a second interlayered insulating layer 130 may be formed on the first interlayered insulating layer 120. Thereafter, an etch stop pattern 140 may be formed on the second interlayered insulating layer 130. The etch stop pattern 140 may be formed by depositing an etch stop layer on the second interlayered insulating layer 130 and pattering the etch stop layer. As an example, the etch stop pattern 140 may be formed to cover a region of the second interlayered insulating layer 130 located on the staircase structure of the stack ST, e.g. to cover a portion of the region of the second interlayered insulating layer 130 located in the upper connection region CNR1.

The etch stop pattern 140 may have a uniform thickness on a flat top surface of the second interlayered insulating layer 130. The etch stop pattern 140 may include a single layer or a plurality of layers. The etch stop pattern 140 may be formed of a material having an etch selectivity with respect to the second interlayered insulating layer 130. For example, the etch stop pattern 140 may be formed of at least one of metals (e.g., doped or undoped poly-silicon, W, Al, and/or Ti) or metal nitrides (e.g., TiN, TaN, and/or WN). The etch stop pattern 140 may be formed of a material that etches slower than that of the second insulating layer 130, e.g. that etches slower during an anisotropic etching process.

After the formation of the etch stop pattern 140, a mask pattern MP may be formed to have openings OP on end portions of the stack ST. The mask pattern MP may be a photoresist pattern and/or a hard mask pattern.

Figure 1C:
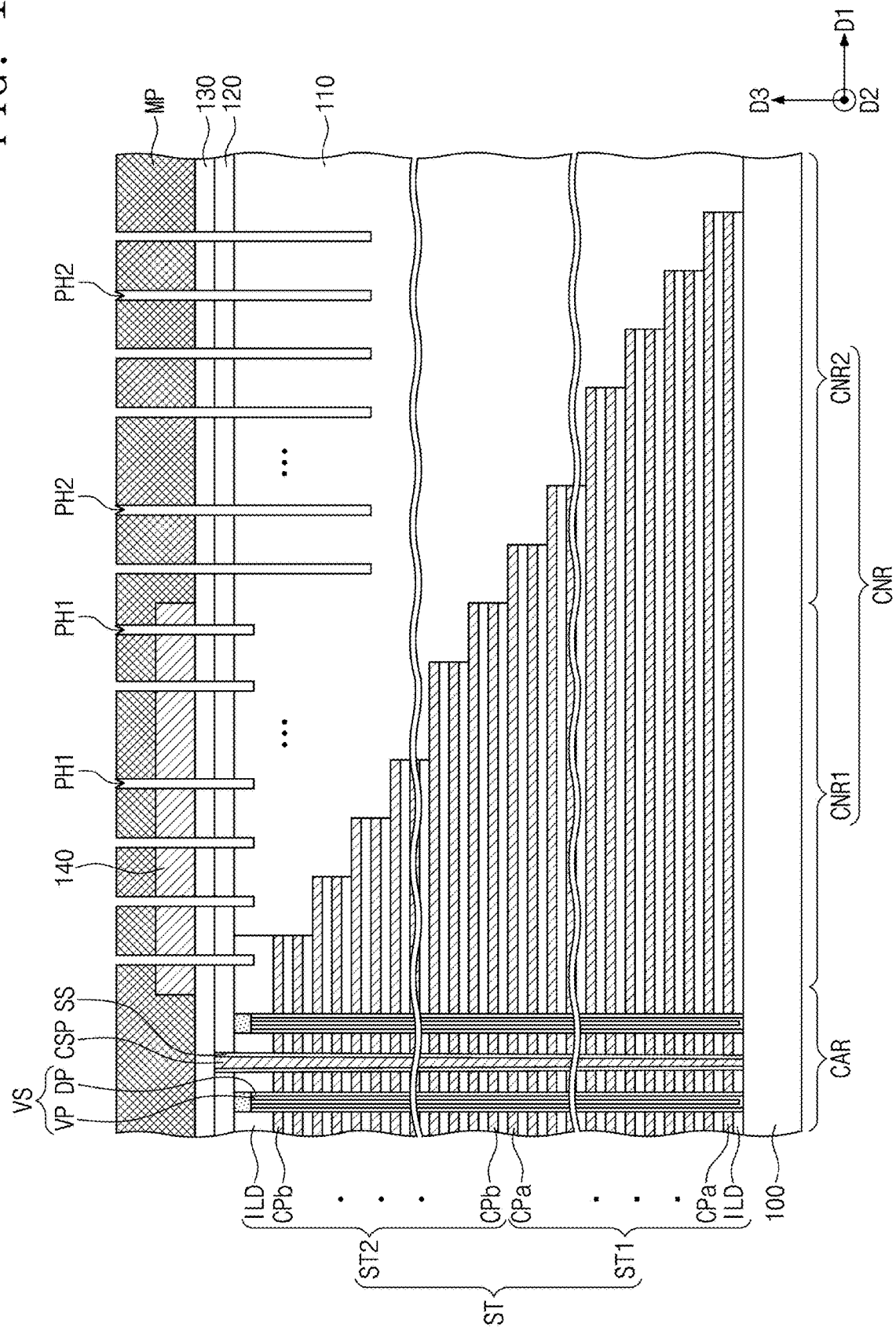

Referring to FIG. 1C, a first anisotropic etching process may be performed on the etch stop pattern 140, the first and second interlayered insulating layers 120 and 130, and the planarization insulating layer 110, using the mask pattern MP as an etch mask.

The first anisotropic etching process may be performed using an etch recipe of anisotropically and successively etching the etch stop pattern 140, the first and second interlayered insulating layers 120 and 130, and the planarization insulating layer 110. The first anisotropic etching process may be or include a dry etching process using plasma, and in this case, etching ions or etching plasma, which are produced from an etching gas, may be supplied through the openings of the mask pattern MP.

As a result of the first anisotropic etching process, first preliminary contact holes PH1 may be formed to penetrate the etch stop pattern 140, and, optionally the insulating layers 130, 120, and portions of 110, and second preliminary contact holes PH2 may be formed to penetrate at least portions of the planarization layer layers 110, the insulating layer 120, and the insulating layer 130 spaced apart from the etch stop pattern 140.

According to some embodiments, the first and second preliminary contact holes PH1 and PH2 may be formed at the same time, but depending on the presence or absence of the etch stop pattern 140, a process of forming the first and second preliminary contact holes PH1 and PH2 may have a difference in etch rate. For example the etch rate of the first preliminary contact holes PH1 may be slower than the etch rate of the second preliminary contact holes PH2. Thus, heights of the first preliminary contact holes PH1 may be larger than heights of the second preliminary contact holes PH2. For example, bottom surfaces of the second preliminary contact holes PH2 may be located at a level lower than bottom surfaces of the first preliminary contact holes PH1. Alternatively or additionally, due to the difference in etch rate between the first and second preliminary contact holes PH1 and PH2, diameters of the second preliminary contact holes PH2 may be greater than diameters of the first preliminary contact holes PH1.

Figure 1D:
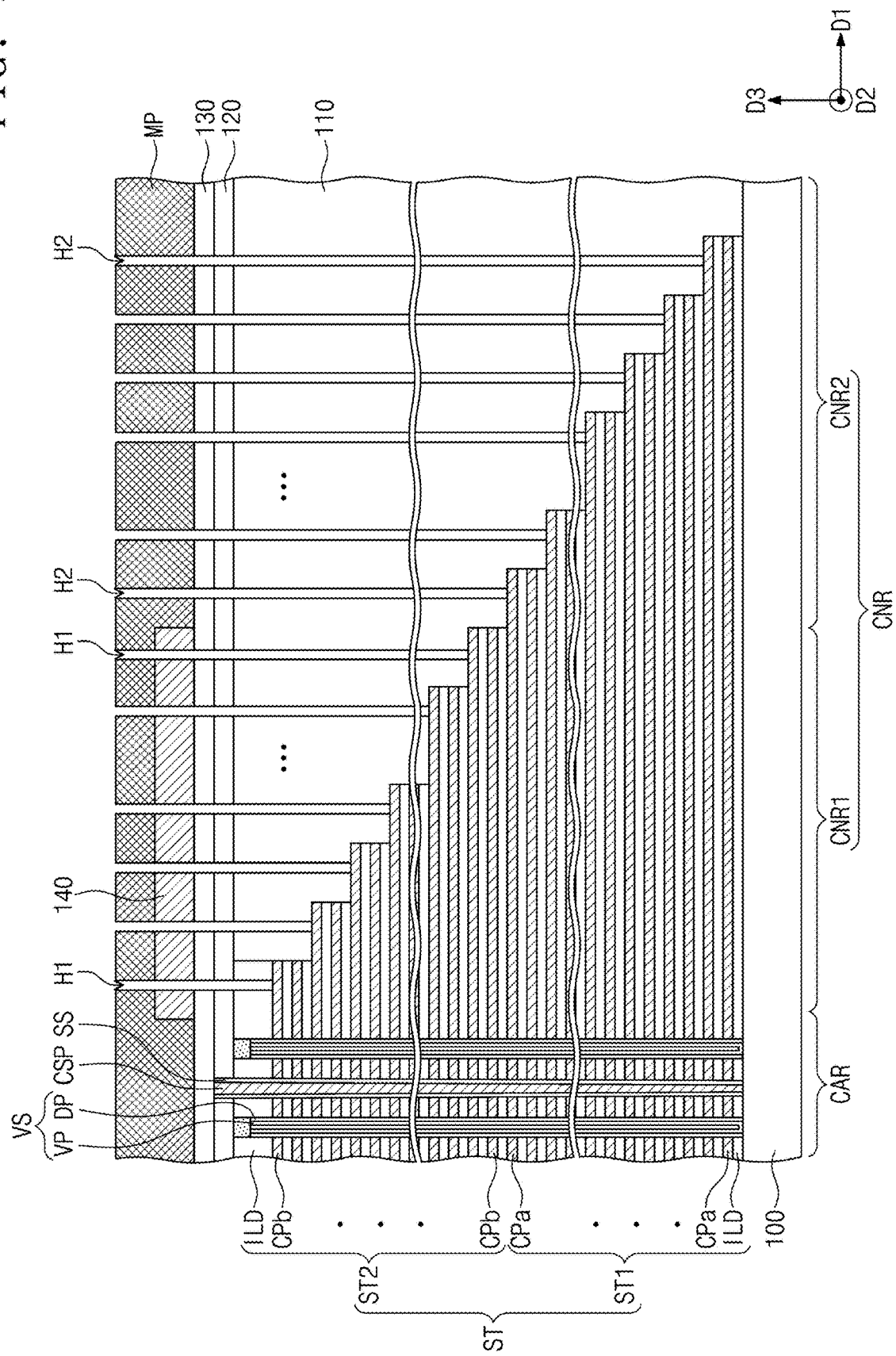

Thereafter, as shown in FIG. 1D, a second anisotropic etching process using the mask pattern MP as an etch mask may be performed to expose the end portions of the conductive patterns CPa and CPb of the stack ST.

In some example embodiments, the second anisotropic etching process may be successively performed under the same condition as that in the first anisotropic etching process. Accordingly, each of first and second contact holes H1 and H2 may be formed to have a sidewall profile that is monotonically connected to a corresponding one of the first and second preliminary contact holes PH1 and PH2.

For example, as a result of the second anisotropic etching process, the first contact holes H1 may be formed to expose the end portions of the conductive patterns CPa and CPb located at an upper region of the stack ST on the upper connection region CNR1, and the second contact holes H2 may be formed to expose the end portions of the conductive patterns CPa and CPb located at a lower region of the stack ST on the lower connection region CNR2. Since the conductive patterns CPa and CPb are located at different levels from the substrate 100, the first and second contact holes H1 and H2 may have bottom surfaces located at different levels.

A top surface of each of the conductive patterns CPa and CPb may be partially recessed during the second anisotropic etching process. For example, portions of the conductive patterns CPa and CPb, which are exposed through the first and second contact holes H1 and H2, may be physically over-etched by plasma, when the first and second contact holes H1 and H2 are formed. Thus, a bottom surface of each of the first and second contact holes H1 and H2 may be located between top and bottom surfaces of a corresponding one of the conductive patterns CPa and CPb.

On a region (e.g., the upper connection region CNR1) provided with the etch stop pattern 140, a depth of the first contact hole H1 from a top surface of each conductive pattern CPb may vary continuously or monotonically in a stacking direction of the conductive patterns CPb. As used herein, monotonic refers to dimensions that increase or stay the same, or, alternatively, decrease or stay the same. For example, portions of the conductive patterns CPb exposed through the first contact holes H1 may have different thicknesses from each other. As an example, the depths of the first contact holes CH1 may decrease with increasing distance from the substrate 100. In addition, on a region (e.g., the lower connection region CNR2) without the etch stop pattern 140, a depth of the second contact hole H2 from a top surface of each conductive pattern CPa may vary monotonically in a stacking direction of the conductive patterns CPa. For example, portions of the conductive patterns CPa exposed through the second contact holes H2 may have different thicknesses from each other. As an example, the depths of the second contact holes CH2 may decrease with increasing distance from the substrate 100. Furthermore, the portions of the conductive patterns CPa and CPb exposed by adjacent ones of the first and second contact holes H1 and H2 may have discontinuous or discrete recess depths. For example, a difference in recess depth between the portions of a conductive pattern CPa and neighboring conductive pattern CPb may be greater than a difference in recess depth between the portions of a conductive pattern CPa and a neighboring conductive pattern CPa, and also greater than a difference in recess depth between the portions of a conductive pattern CPb and a neighboring conductive pattern CPb. Furthermore, there may be an inflection IFX between recess depths R1*d* and R2*a*.

After the formation of the first and second contact holes H1 and H2, the mask pattern MP may be removed.

Figure 1E:
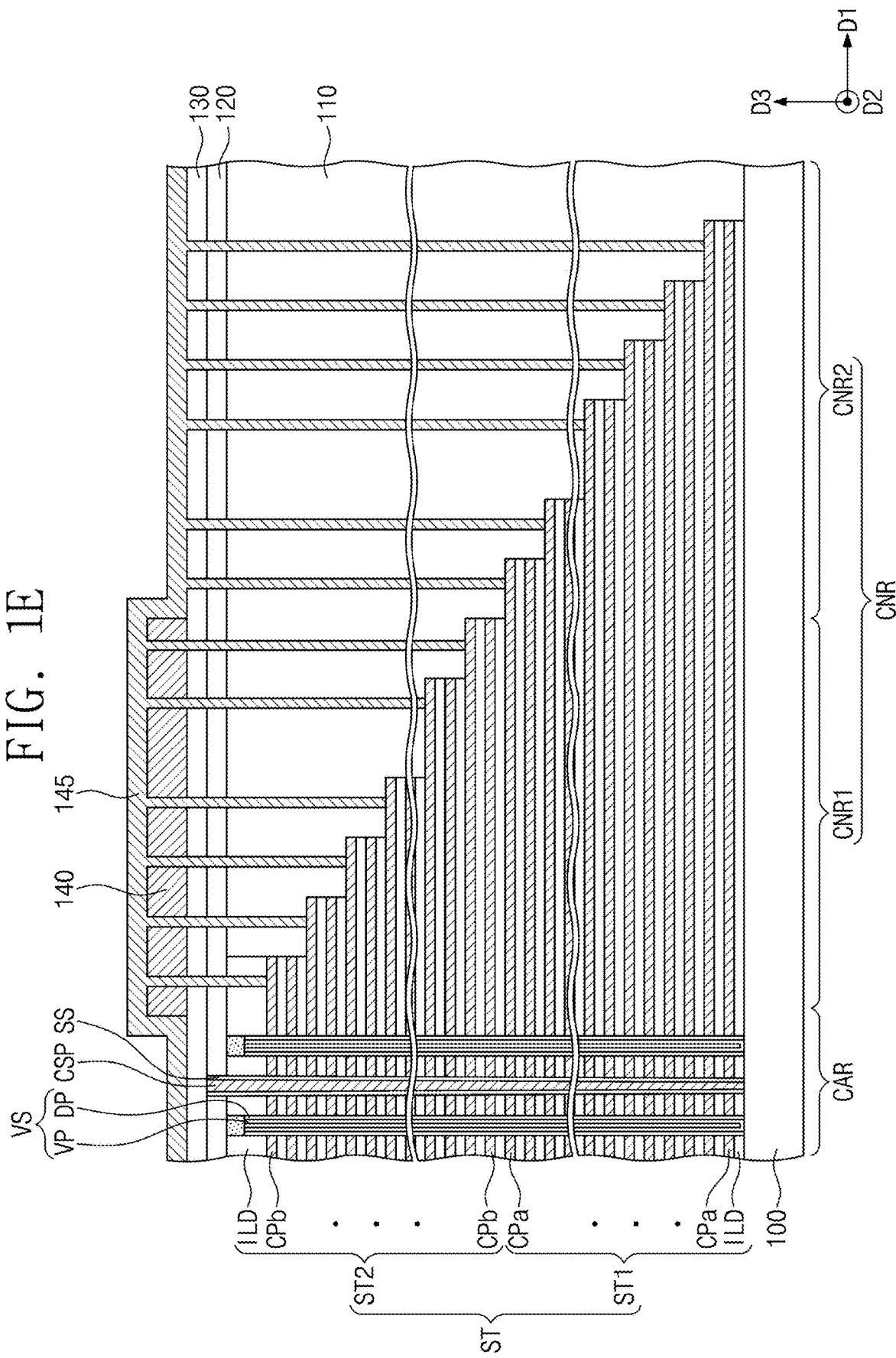

Thereafter, as shown in FIG. 1E, a contact conductive layer 145 may be formed to fill the first and second contact holes H1 and H2. The contact conductive layer 145 may completely fill the first and second contact holes H1 and H2 and may be deposited on the etch stop pattern 140 and the second interlayered insulating layer 130. The contact conductive layer 145 may be formed of or include at least one of metals (e.g., W, Al, and/or Ti), and may be deposited with a CVD process.

Figure 1F:
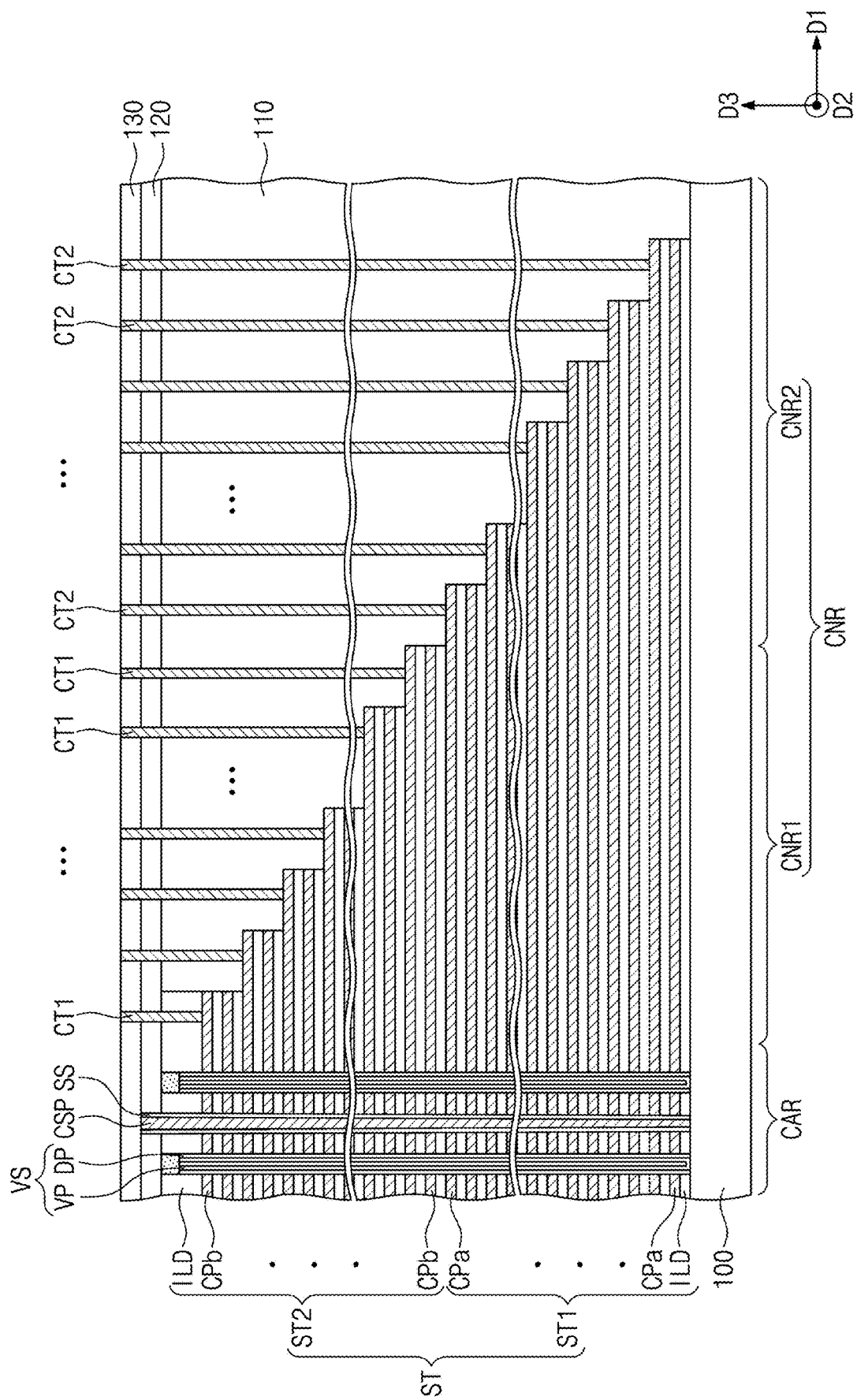

Referring to FIG. 1F, a planarization process may be performed to expose the second interlayered insulating layer 130, and thus, first and second contact plugs CT1 and CT2 may be formed in the first and second contact holes H1 and H2, respectively.

A chemical mechanical polishing (CMP) process and/or an etch back process may be performed as the planarization process. The contact conductive layer 145 and the etch stop pattern 140 may also be removed during the planarization process. For example, a polishing selectivity and/or an etch selectivity between the contact conductive layer 145 and the etch stop pattern 140 during the planarization process may be about 1:1.

Figure 1G:
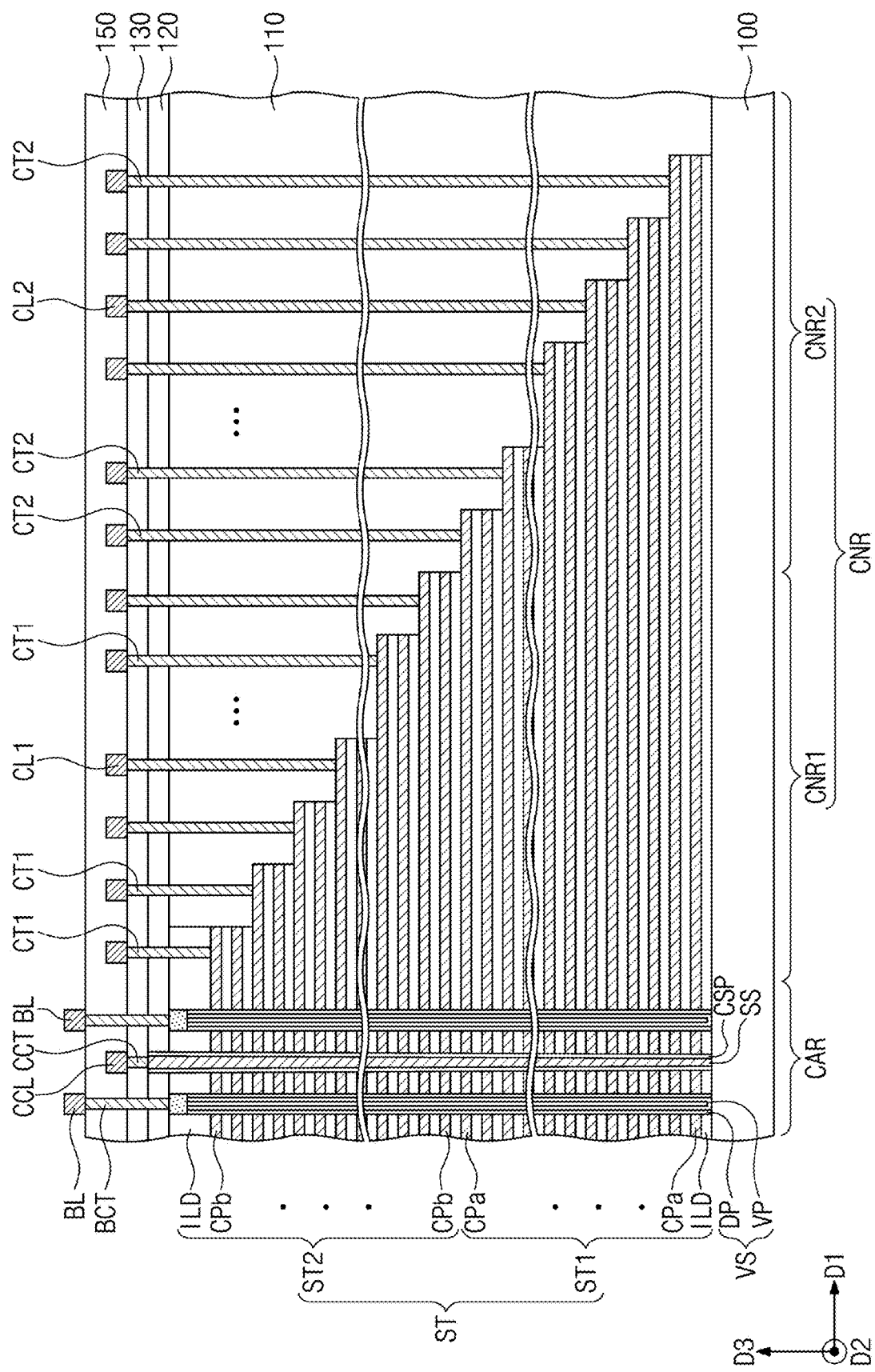

Referring to FIG. 1G, a source contact plug CCT may be formed on the cell array region CAR and may be coupled to the common source conductive pattern CSP. A cell interconnection line CCL and connection interconnection lines CL1 and CL2 may be formed on the second interlayered insulating layer 130. The cell interconnection line CCL may be coupled to the source contact plug CCT, and the connection interconnection lines CL1 and CL2 may be connected to the first and second contact plugs CT1 and CT2, respectively.

A third interlayered insulating layer 150 may be formed on the second interlayered insulating layer 130, and bit line contact plugs BCT coupled to the vertical semiconductor patterns VP and bit lines BL coupled to the bit line contact plugs BCT may be formed on the cell array region CAR.

Hereinafter, a three-dimensional semiconductor memory device fabricated by the fabrication method according to some example embodiments of inventive concepts will be described in more detail with reference to FIGS. 1G, 2A, 2B, and 2C.

Figure 2B:
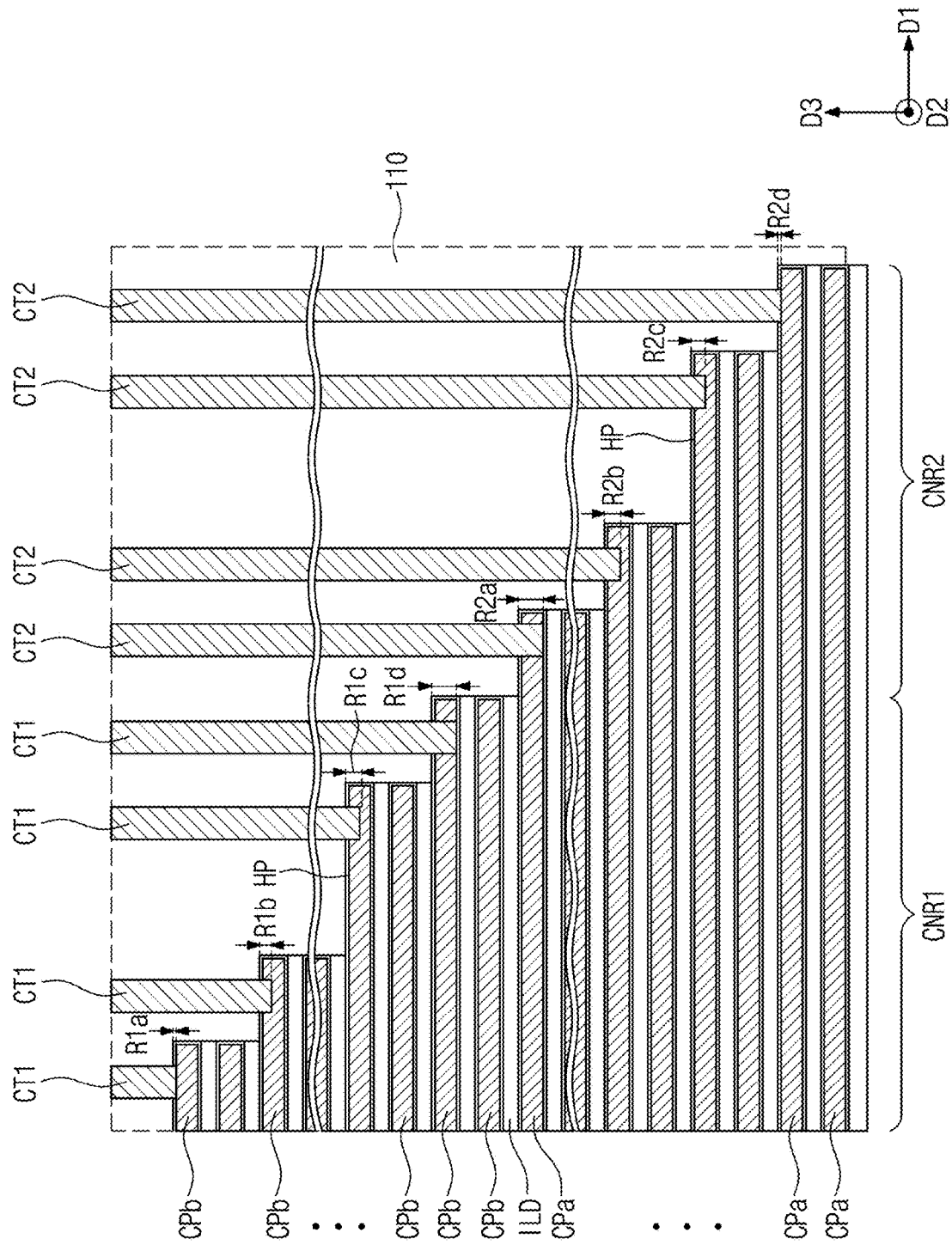
Figure 2C:
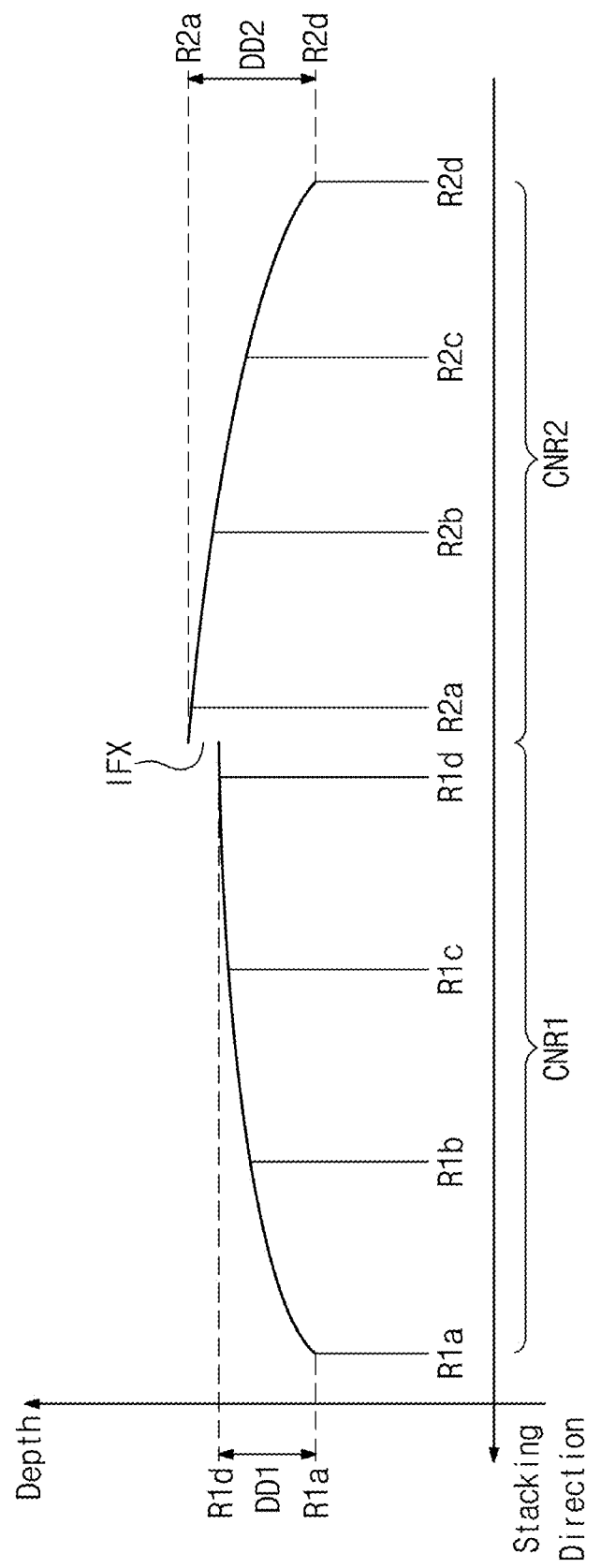
FIG. 2C is a graph showing a change in recess depth of contact plugs, which are provided in the three-dimensional semiconductor memory device fabricated by the fabrication method of FIGS. 1A to 1G.

FIGS. 2A and 2B are sectional views illustrating a portion of a connection region of a three-dimensional semiconductor memory device fabricated by the fabrication method of FIGS. 1A to 1G. FIG. 2C is a graph showing a change in recess depth of contact plugs, which are provided in the three-dimensional semiconductor memory device fabricated by the fabrication method of FIGS. 1A to 1G.

Referring to FIGS. 1G and 2A, the stack ST may include the insulating patterns ILD and the conductive patterns CPa and CPb, which are vertically and alternately stacked on the substrate 100. The stack ST may have a staircase structure on the connection region CNR.

In some example embodiments, the stack ST may include the lower stack ST1 and the upper stack ST2 on the lower stack ST1, and each of the lower and upper stacks ST1 and ST2 may include the insulating patterns ILD and the conductive patterns CPa and CPb, which are vertically and alternately stacked on the substrate 100. A number of layers of the insulating patterns ILD and the conductive patterns CPb on the upper stack ST2 may be the same as, or different from, a number of layers of the insulating patterns ILD and the conductive patterns CPa on the lower stack ST1.

The conductive patterns CPa of the lower stack ST1 may have end portions located on the lower connection region CNR2, and the conductive patterns CPb of the upper stack ST2 may have end portions located on the upper connection region CNR1. In some example embodiments, the upper connection region CNR1 may correspond to a region, on which the etch stop pattern 140 in the fabricating method described with reference to FIGS. 1A to 1G is provided, and the lower connection region CNR2 may correspond to a region, on which the etch stop pattern 140 is not provided.

The horizontal insulating pattern HP may cover the top and bottom surfaces of each of the conductive patterns CPa and CPb. The horizontal insulating pattern HP may include a blocking insulating layer, which is used as a part of the data storing layer of the NAND FLASH memory device. In some example embodiments, the horizontal insulating pattern HP may horizontally extend from the cell array region CAR to the connection region CNR. A portion of the horizontal insulating pattern HP may be disposed between the planarization insulating layer 110 and the top surface of the conductive pattern.

The planarization insulating layer 110 may cover the staircase structure of the stack ST on the substrate 100. The planarization insulating layer 110 may be in contact with side surfaces of the insulating patterns ILD, and the side surfaces of the insulating patterns ILD may be vertically aligned to sides surfaces of the conductive patterns CPa and CPb located thereon. The planarization insulating layer 110 may be in contact with, e.g. in direct contact with portions of the horizontal insulating pattern HP, which is disposed on the connection region CNR and covers the top and bottom surfaces of the conductive patterns.

The planarization insulating layer 110 may be a single layer, which is made of a single insulating material. As an example, the planarization insulating layer 110 may be formed of or include or consist of silicon oxide. The planarization layer 110 may be a homogenous layer. The planarization insulating layer 110 may have a substantially flat top surface and may have a thickness decreasing with decreasing distance from the cell array region CAR.

The first and second interlayered insulating layers 120 and 130 may be sequentially stacked on the planarization insulating layer 110. The first contact plugs CT1 may be provided to penetrate the first and second interlayered insulating layers 120 and 130 and the planarization insulating layer 110 and may be respectively coupled to the conductive patterns CPb of the upper stack ST2. The second contact plugs CT2 may be provided to penetrate the first and second interlayered insulating layers 120 and 130 and the planarization insulating layer 110 and may be respectively coupled to the conductive patterns CPa of the lower stack ST1. In some example embodiments, a plurality of the first contact plugs CT1 and a plurality of the second contact plugs CT2 may be arranged in the first direction D1, and the first and second contact plugs CT1 and CT2 may be respectively coupled to the conductive patterns CPa and CPb disposed at even-numbered layers. Top surfaces of the first and second contact plugs CT1 and CT2 may be located at substantially the same height from a top surface of the substrate 100. As an example, the top surfaces of the first and second contact plugs CT1 and CT2 may be substantially coplanar with the top surface of the second interlayered insulating layer 130. Heights of the first and second contact plugs CT1 and CT2 in a third direction D3 may decrease with decreasing distance from the cell array region CAR.

According to some embodiments of inventive concepts, each of the first and second contact plugs CT1 and CT2 may be extended to a level lower than a top surface of a corresponding one of the conductive patterns CPa and CPb. For example, each of the first and second contact plugs CT1 and CT2 may have a bottom surface, which is located between top and bottom surfaces of a corresponding one of the conductive patterns CPa and CPb.

Positions of the bottom surfaces of the first contact plugs CT1 on the upper stack ST2 may be different from one another, when each of them is measured from a top surface of a corresponding one of the conductive patterns CPb. For example, the recess depths of the first contact plugs CT1 may be different from each other, when each of them is measured from a top surface of a corresponding one of the conductive patterns CPb. Here, the recess depths of the first contact plugs CT1 may vary monotonically in a stacking direction of the conductive patterns CPb. In some example embodiments, the recess depth of each contact plug CT1 or CT2 may correspond to a distance between a top surface of a corresponding conductive pattern CPa or CPb and a bottom surface of the contact plug CT1 or CT2. Positions of the bottom surfaces of the second contact plugs CT2 on the lower stack ST1 may be different from each other, when each of them is measured from a top surface of a corresponding one of the conductive patterns CPa. For example, the recess depths of the second contact plugs CT2 may be different from each other, when each of them is measured from a top surface of a corresponding one of the conductive patterns CPa. Here, the recess depths of the second contact plugs CT2 may vary monotonically in a stacking direction of the conductive patterns CPa.

A height of the staircase structure of the stack ST may increase in the stacking direction. For example, the stacking direction may be a direction opposite to the first direction D1 (e.g., see FIGS. 2A, 2B and 2C), and may be perpendicular to a surface of the substrate.

Referring to FIGS. 2A and 2C, as a level of the conductive pattern CPa of the lower stack ST1 increases, a recess depth of the second contact plug CT2 coupled thereto may be monotonically increased (e.g., R2$a$>R2$b$ . . . >R2$c$>R2$d$ or R2$a$>=R2$b$ . . . >=R2$c$>=R2$d$). As a level of the conductive pattern CPb of the upper stack ST2 increases, a recess depth of the first contact plug CT1 coupled thereto may be monotonically decreased (e.g., R1$a$<R1$b$ . . . <R1$c$<R1$d$ or R1$a$<=R1$b$ . . . <=R1$c$<=R1$d$). The recess depths of adjacent ones of the first and second contact plugs CT1 and CT2 may have discrete values (e.g., R1$d$<R2$a$), or may take a large jump compared to differences of neighboring contact plugs CT1 or neighboring contact plugs CT2. As an example, the difference between R2$a$ and R1$d$ may be more than the difference between R1$d$ and R1$c$. The recess depths of the first and second contact plugs CT1 and CT2 may range from about 50 Å to 350 Å (or 5 nm to 35 nm).

Concretely, a distance between a top surface of the uppermost one of the conductive patterns CPb of the upper stack ST2 and a bottom surface of a corresponding one of the first contact plugs CT1 may be or correspond to a first recess depth R1$a$. A distance between a top surface of the lowermost one of the conductive patterns CPb of the upper stack ST2 and a bottom surface of a corresponding one of the first contact plugs CT1 may be or correspond to a second recess depth R1$d$ greater than the first recess depth R1$a$. In the upper stack ST2, recess depths R1$b$ and R1$c$ of the first contact plugs CT1, which are coupled to the conductive patterns CPb located between the uppermost and lowermost ones of the conductive patterns CPb, may be greater than the first recess depth R1$a$ and may be smaller than the second recess depth R1$d$.

A distance between a top surface of the uppermost one of the conductive patterns CPa of the lower stack ST1 and a bottom surface of a corresponding one of the second contact plugs CT2 may be a third recess depth R2$a$. Here, the third recess depth R2$a$ may be greater than the second recess depth R1$d$. A distance between a top surface of the lowermost one of the conductive patterns CPa of the lower stack ST1 and a bottom surface of a corresponding one of the second contact plugs CT2 may be a fourth recess depth R2$d$ larger than the third recess depth R2$a$. In the lower stack ST1, recess depths R2$b$ and R2$c$ of the second contact plugs CT2, which are coupled to the conductive patterns CPa located between the uppermost and lowermost ones of the conductive patterns CPa, may be greater than the third recess depth R2$a$ and may be less than the fourth recess depth R2$d$. A first difference in recess depth between adjacent ones of the first contact plugs CT1 (e.g., a difference between R1$a$ and R1b, between R1$b$ and R1$c$, or between R1$c$ and R1$d$) may be different from a second difference in recess depth between adjacent ones of the first and second contact plugs CT1 and CT2 (e.g., a difference between R1$d$ and R2$d$). As an example, the first difference may range from 5 Å to 50 Å, and the second difference may range from 30 Å to 100 Å (e.g. 3 nm to 10 nm).

A first change amount DD1 of the recess depths of the first contact plugs CT1 on the upper stack ST2 may be different from a second change amount DD2 of the recess depths of the second contact plugs CT2 on the lower stack ST1. As an example, the first change amount DD1 of the recess depths of the first contact plugs CT1 on the upper stack ST2 may be less than the second change amount DD2 of the recess depths of the second contact plugs CT2 on the lower stack ST1. The first change amount DD1 may correspond to a difference between the largest and smallest values R1$d$ and R1$a$ of the recess depths of the first contact plugs CT1, and the second change amount DD2 may correspond to a difference between the largest and smallest values R2$d$ and R2$a$ of the recess depths of the second contact plugs CT2. In some example embodiments, the first change amount DD1 may range from about 30 Å to about 80 Å, e.g. 3 nm to 8 nm, and the second change amount DD2 may range from about 40 Å to about 100 Å, e.g. 4 nm to 10 nm.

In some example embodiments, the first contact plugs CT1 may have a first average upper diameter A, and the second contact plugs CT2 may have a second average upper diameter B, which is different than, e.g. less than the first upper diameter A. For example, adjacent ones of the first and second contact plugs CT1 and CT2 may have diameters different from each other. The difference in diameter between the first and second contact plugs CT1 and CT2 may range from about 50 Å to about 100 Å, e.g. about 5 nm to 10 nm.

Furthermore, a diameter of the first contact plug CT1 coupled to the lowermost conductive pattern CPb of the upper stack ST2 may be greater than a diameter of the first contact plug CT1 coupled to the uppermost conductive pattern CPb of the upper stack ST2. Similarly, a diameter of the second contact plug CT2 coupled to the lowermost conductive pattern CPa of the lower stack ST1 may be greater than a diameter of the second contact plug CT2 coupled to the uppermost conductive pattern CPa of the lower stack ST1.

Referring to FIG. 2B, the first contact plug CT1 coupled to the uppermost conductive pattern CPb of the upper stack ST2 may have a bottom surface, which is located at substantially the same level as a top surface of the uppermost conductive pattern CPb. The first contact plug CT1 coupled to the lowermost conductive pattern CPb of the upper stack ST2 may have a bottom surface, which is located at substantially the same level as a bottom surface of the lowermost conductive pattern CPb. In other words, the first contact plug CT1 may penetrate the lowermost conductive pattern CPb.

Similarly, the second contact plug CT2 coupled to the uppermost conductive pattern CPa of the lower stack ST1 may penetrate the uppermost conductive pattern CPa. The second contact plug CT2 coupled to the uppermost conductive pattern CPa of the lower stack ST1 may have a bottom surface, which is located at substantially the same level as a bottom surface of the uppermost conductive pattern CPa. The second contact plug CT2 coupled to the lowermost conductive pattern CPa of the lower stack ST1 may have a bottom surface, which is located at substantially the same level as a top surface of the lowermost conductive pattern CPa.

Figure 3A:
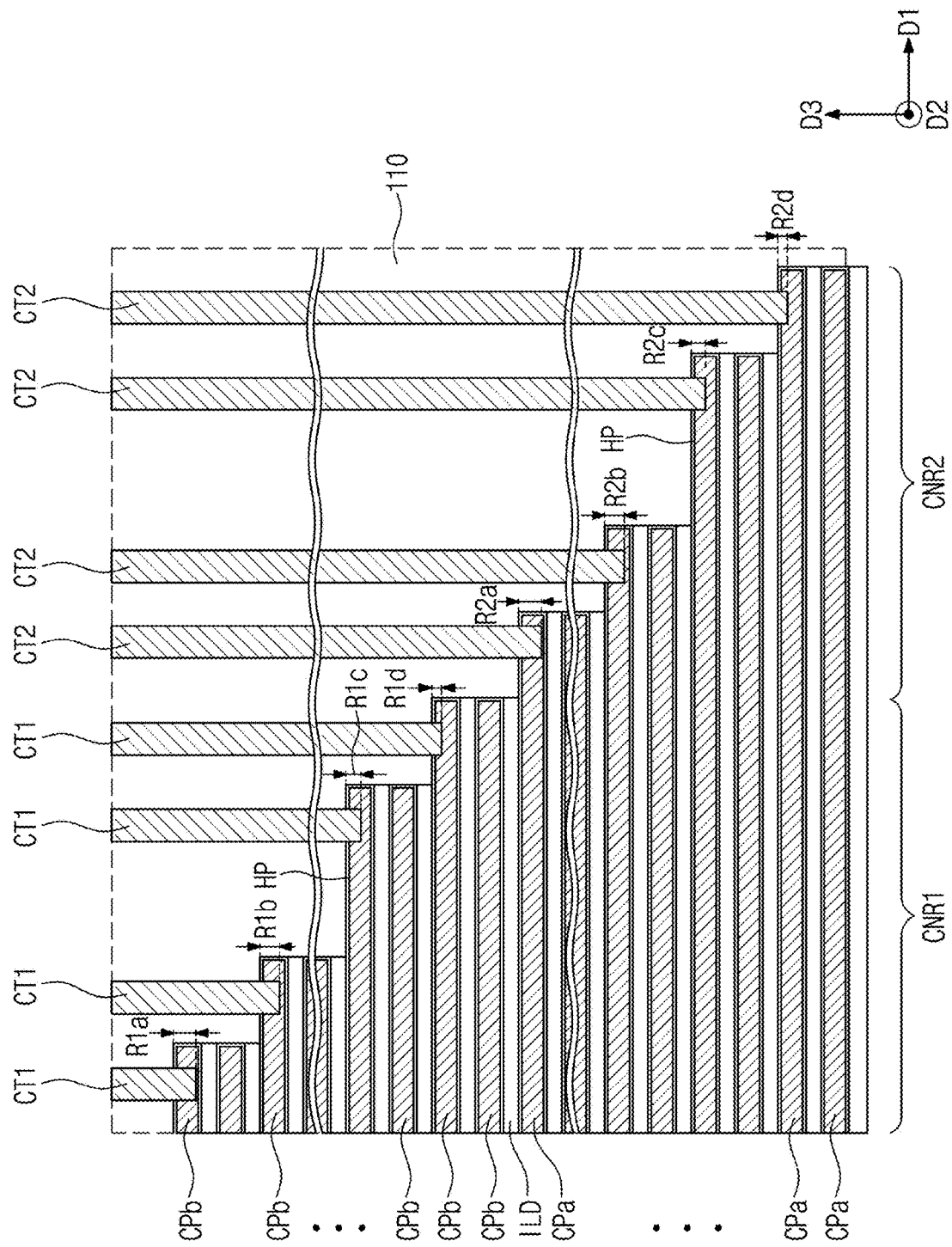
FIG. 3A is a sectional view illustrating a portion of the connection region of the three-dimensional semiconductor memory device fabricated by the fabrication method of FIGS. 1A to 1G.
Figure 3B:
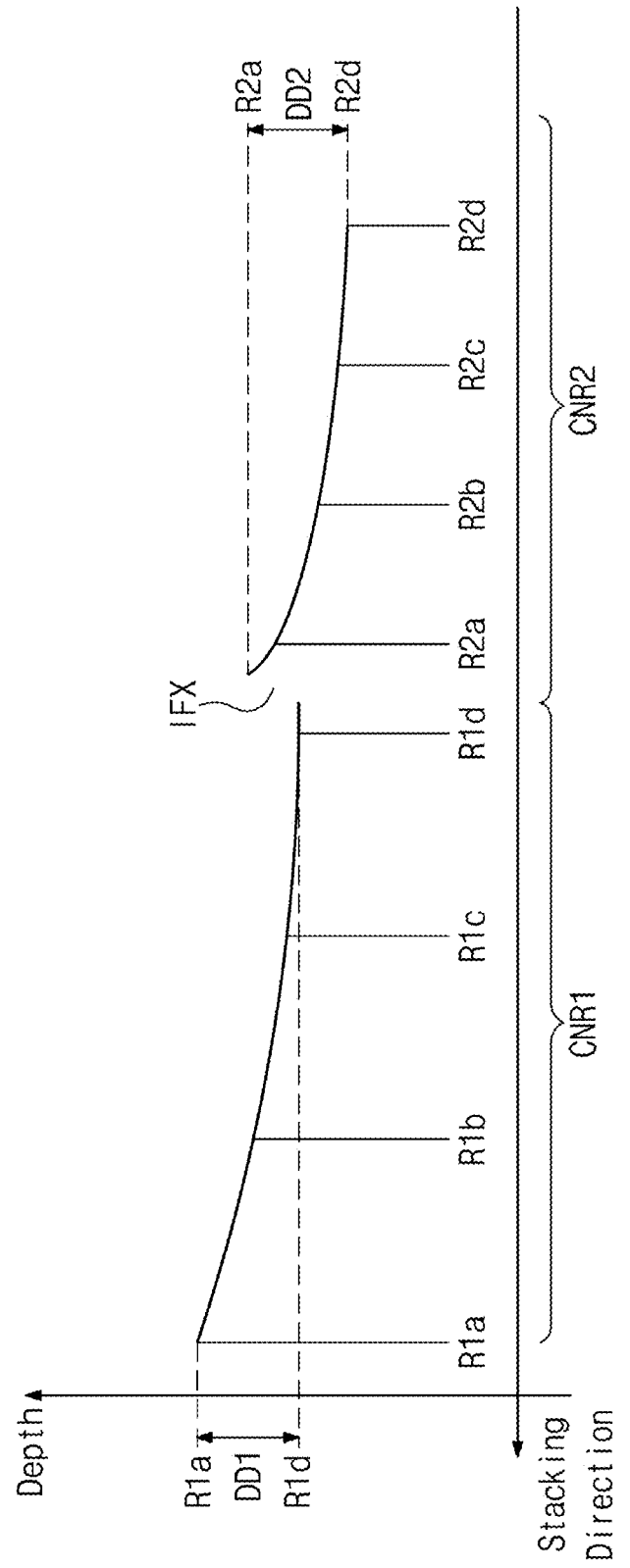
FIG. 3B is a graph showing a change in recess depth of contact plugs, which are provided in the three-dimensional semiconductor memory device of FIG. 3A.

FIG. 3A is a sectional view illustrating a portion of the connection region of the three-dimensional semiconductor memory device fabricated by the fabrication method of FIGS. 1A to 1G. FIG. 3B is a graph showing a change in recess depth of contact plugs, which are provided in the three-dimensional semiconductor memory device of FIG. 3A.

Referring to FIGS. 1G, 3A, and 3B, recess depths R2a, R2b, R2c, and R2d of the first contact plugs CT1 coupled to the conductive patterns CPa of the lower stack ST1 may gradually decrease in a direction from the uppermost conductive pattern CPa to the lowermost conductive pattern CPa. For example, the taller the vertical lengths of the first contact plugs CT1, the less the recess depths R2a, R2b, R2c, and R2d of the first contact plugs CT1. This may be true for the second contact plugs CT2 coupled to the upper stack ST2. Furthermore, as described above, a difference in recess depth between adjacent ones of the first and second contact plugs CT1 and CT2 may be greater than a difference in recess depth between adjacent ones of the first contact plugs CT1 or between adjacent ones of the second contact plugs CT2.

Figure 4:
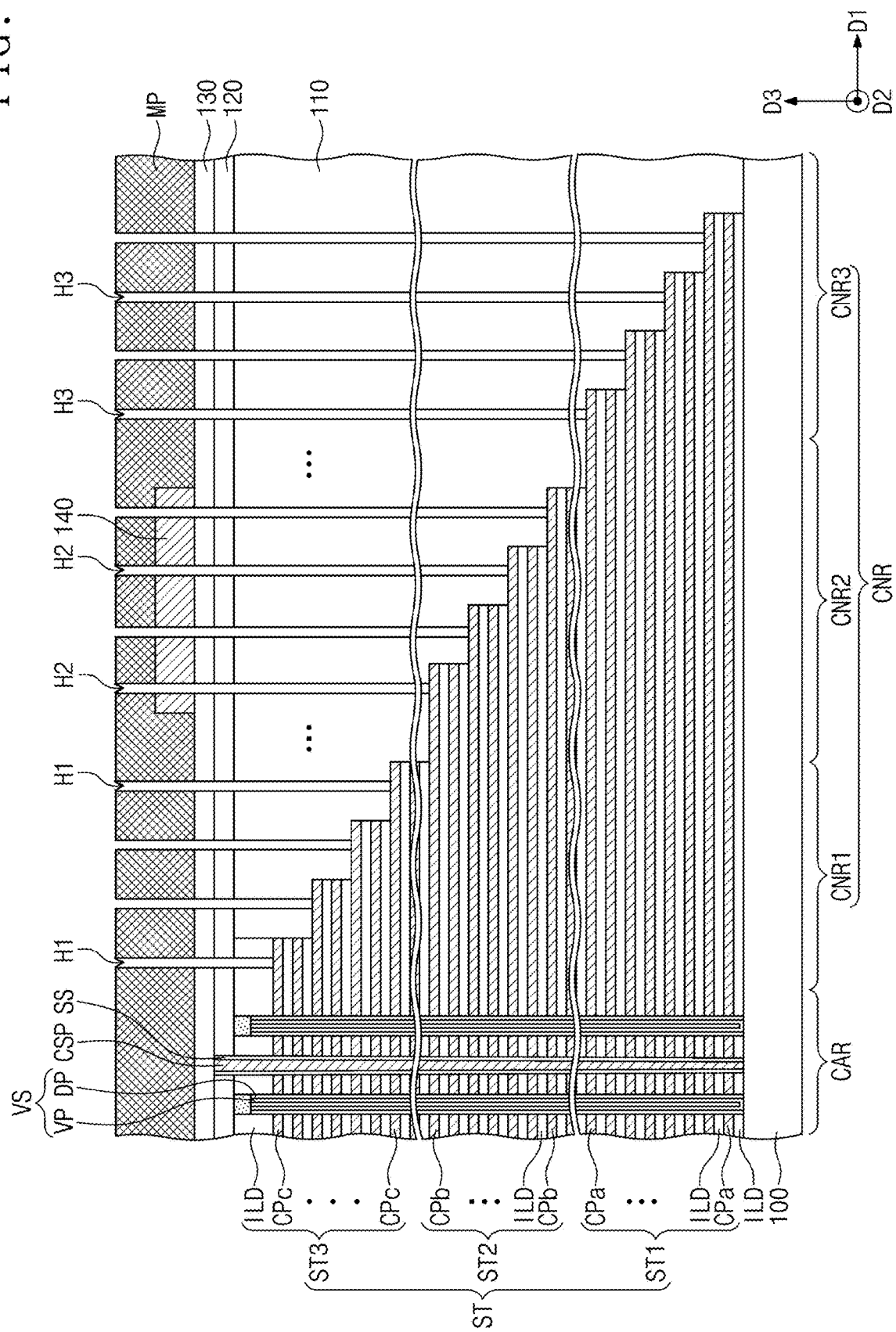
FIG. 4 is a sectional view illustrating a method of fabricating a three-dimensional semiconductor memory device according to some example embodiments of inventive concepts.
Figure 5:
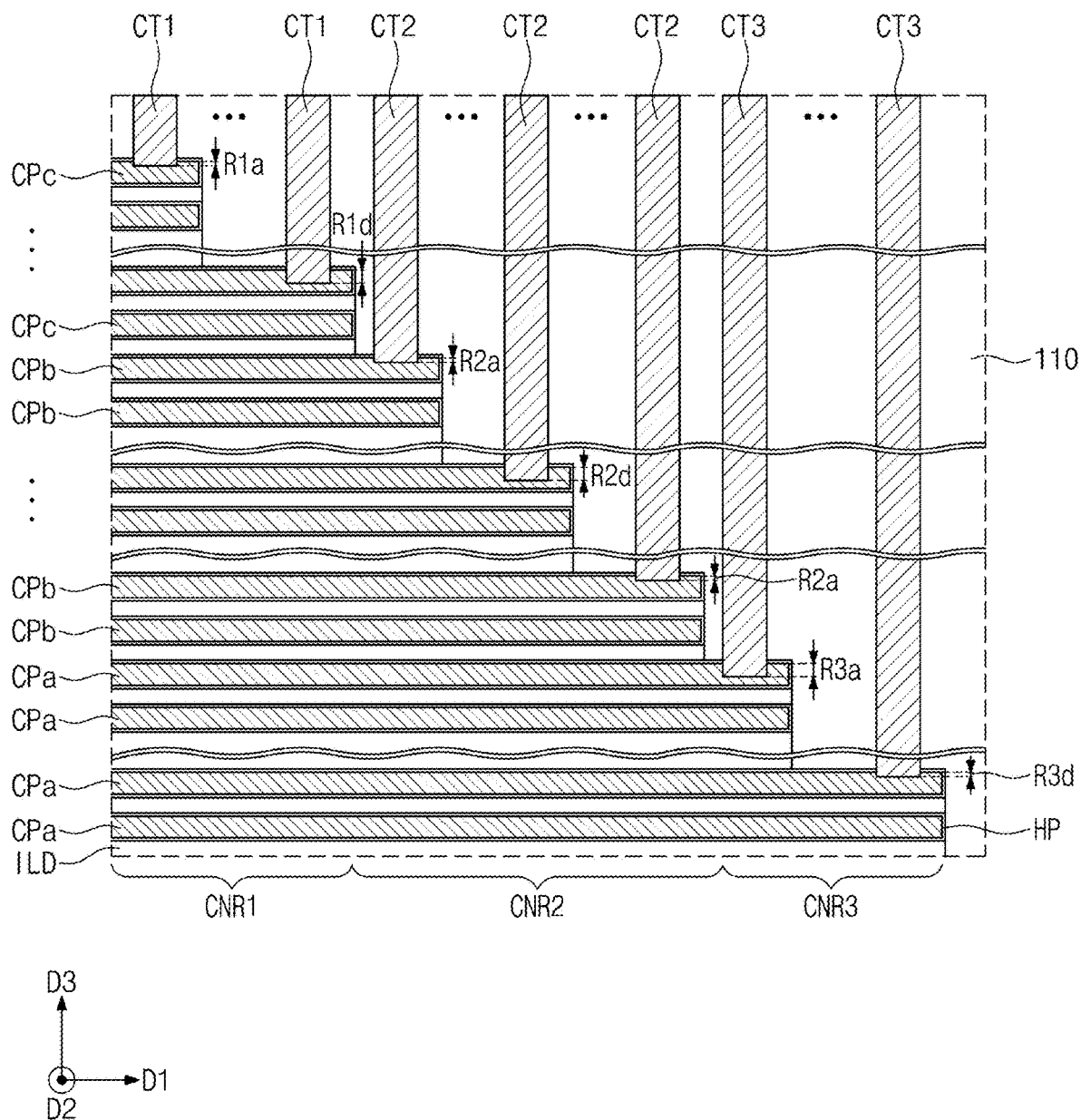
FIG. 5 is a sectional view illustrating a portion of a connection region of a three-dimensional semiconductor memory device fabricated by the fabrication method of FIG. 4.
Figure 6:
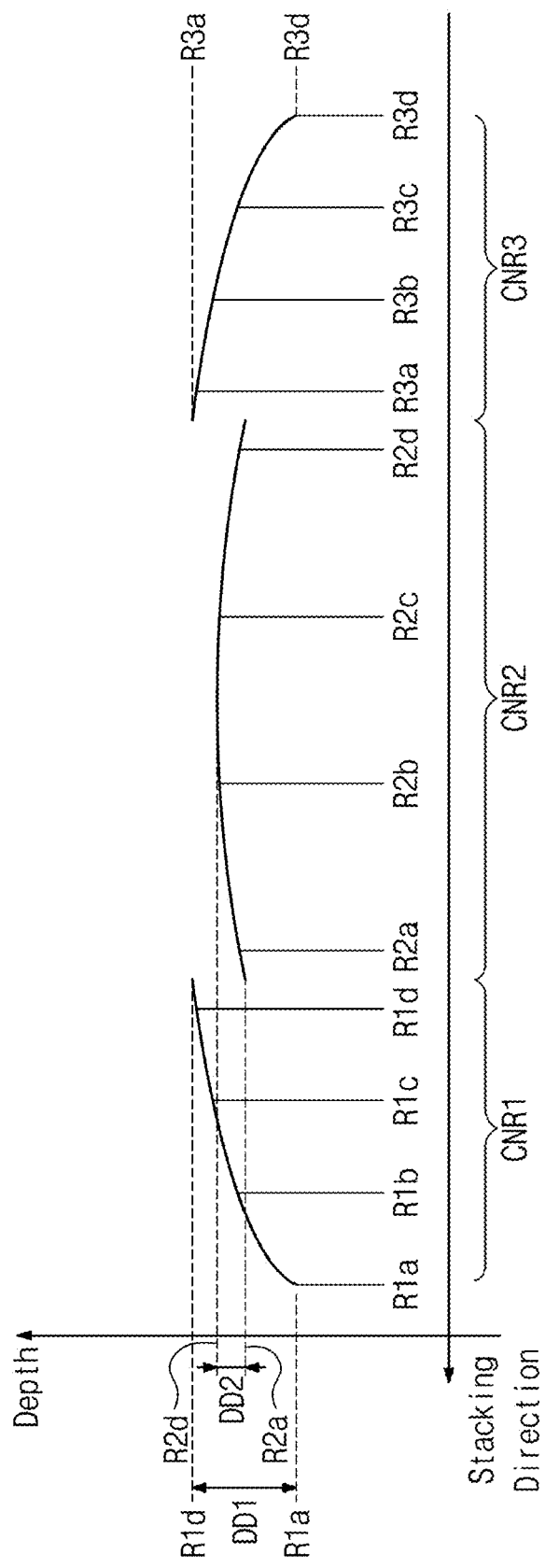
FIG. 6 is a graph showing a change in recess depth of contact plugs, which are provided in a three-dimensional semiconductor memory device fabricated by the fabrication method of FIG. 4.

FIG. 4 is a sectional view illustrating a method of fabricating a three-dimensional semiconductor memory device according to some example embodiments of inventive concepts. FIG. 5 is a sectional view illustrating a portion of a connection region of a three-dimensional semiconductor memory device fabricated by the fabrication method of FIG. 4. FIG. 6 is a graph showing a change in recess depth of contact plugs, which are provided in a three-dimensional semiconductor memory device fabricated by the fabrication method of FIG. 4. For concise description, an elements previously described with reference to FIGS. 1A to 1G may be identified by the same reference number without repeating an overlapping description thereof.

Referring to FIG. 4, the connection region CNR of the substrate 100 may include a lower connection region CNR3, an upper connection region CNR1, and an intermediate connection region CNR2 therebetween.

The stack ST may include a lower stack ST1, an intermediate stack ST2, and an upper stack ST3, which are sequentially stacked on the substrate 100, and each of the lower, intermediate, and upper stacks ST1, ST2, and ST3 may include the insulating patterns ILD and conductive patterns CPa, CPb, and CPc, which are vertically and alternately stacked on the substrate 100. A number of layers of the insulating patterns ILD in each of the lower, intermediate, and upper stacks ST1, ST2, and ST3 may be the same as, or may be different from, each other. The conductive patterns CPa, CPb, and CPc of the lower, intermediate, and upper stacks ST1, ST2, and ST3 may be formed to form a staircase structure on the connection region CNR, when viewed in a sectional view taken along the first direction D1. End portions of the conductive patterns CPa of the lower stack ST1 may be disposed on the lower connection region CNR3, end portions of the conductive patterns CPb of the intermediate stack ST2 may be disposed on the intermediate connection region CNR2, and end portions of the conductive patterns CPc of the upper stack ST3 may be disposed on the upper connection region CNR1.

As described with reference to FIG. 1B, the planarization insulating layer 110 and the first and second interlayered insulating layers 120 and 130 may be formed to cover the stack ST, and the etch stop pattern 140 may be formed on a flat top surface of the second interlayered insulating layer 130. In some example embodiments, the etch stop pattern 140 may be formed on the intermediate connection region CNR2.

Similar to the method described with reference to FIGS. 1C and 1D, contact holes H1, H2, and H3 may be formed to penetrate the etch stop pattern 140, the first and second interlayered insulating layers 120 and 130, and the planarization insulating layer 110, after the formation of the etch stop pattern 140.

As described above, the contact holes H1, H2, and H3 may be formed to expose the end portions of the conductive patterns CPa, CPb, and CPc, respectively, of the stack ST, and top surfaces of the conductive patterns CPa, CPb, and CPc may be recessed by an anisotropic etching process for forming the contact holes H1, H2, and H3. In some example embodiments, the contact holes H1, H2, and H3 may include first contact holes H1 respectively exposing the conductive patterns CPc of the upper stack ST2, second contact holes H2 respectively exposing the conductive patterns CPb of the intermediate stack ST2, and third contact holes H3 respectively exposing the conductive patterns CPa of the lower stack ST1.

According to some example embodiments of inventive concepts, there may be the etch stop pattern 140 on the intermediate connection region CNR2, when the first to third contact holes H1, H2, and H3 are formed at the same time. Accordingly, recess depths of the conductive patterns CPb exposed through the second contact holes H2 on the intermediate connection region CNR2 may be less than recess depths of conductive patterns CPa and CPc exposed through the first and third contact holes H1 and H3 on the lower and upper connection regions CNR1 and CNR3.

In a case where the first to third contact holes H1, H2, and H3 are formed at the same time, the recess depths of the first contact holes H1 may vary monotonically in a stacking direction of the conductive patterns CPc of the upper stack ST3, the recess depths of the second contact holes H2 may vary in a manner so as to obtain a local maximum in the stacking direction of the conductive patterns CPb of the intermediate stack ST2, and the recess depths of the third contact holes H3 may vary monotonically in a stacking direction of the conductive patterns CPb of the intermediate stack ST2, when measured from a top surface of a corresponding one of the conductive patterns CPa, CPb, and CPc. Here, the recess depths of adjacent ones of the first and second contact holes H1 and H2 may have discrete values (e.g. may take a discrete jump), and the recess depths of adjacent ones of the second and third contact holes H2 and H3 may have discrete values (e.g. may take a discrete jump). As an example, the difference between recess depths of a second contact hole H2 and a neighboring first contact hole H1 may be greater than the recess depth of a first contact hole H1 and an adjacent first contact hole H1. Additionally or alternatively, the difference between recess depths of a third contact hole H3 and an adjacent second contact hole H2 may be greater than the difference between recess depths of a second contact hole H2 and an adjacent second contact hole H2.

As shown in FIG. 5, after the formation of the first to third contact holes H1, H2, and H3, first to third contact plugs CT1, CT2, and CT3 may be formed in the first to third contact holes H1, H2, and H3, respectively. The etch stop pattern 140 on the second interlayered insulating layer 130 may be removed, after the formation of the first to third contact plugs CT1, CT2, and CT3, as described above.

Referring to FIGS. 5 and 6, the first contact plug CT1 coupled to the uppermost conductive pattern CPc of the upper stack ST3 may have a first recess depth R1$a$, and the first contact plug CT1 coupled to the lowermost conductive pattern CPc of the upper stack ST3 may have a second recess depth R1$d$ larger than the first recess depth R1$a$. The recess depths of the first contact plugs CT1 may vary monotonically in a stacking direction of the conductive patterns CPc of the upper stack ST3 and may be within a range between the first and second recess depths R1$a$ and R1$d$.

The second contact plug CT2 coupled to the uppermost conductive pattern CPb of the intermediate stack ST2 may have a third recess depth R2$a$, and the second contact plug CT2 coupled to the lowermost conductive pattern CPb of the intermediate stack ST2 may have a fourth recess depth R2$d$, which is equal to or different from the third recess depth R2$a$. One of the second contact plugs CT2 may have a recess depth R2$d$, which is the largest value of the recess depths of the second contact plugs CT2. The recess depths of the second contact plugs CT2 may vary in a manner so as to obtain a local maximum in the stacking direction of the conductive patterns CPb of the intermediate stack ST2 and may be within a range from the third recess depth R2$a$ to the largest recess depth R2$d$.

The third contact plug CT3 coupled to the uppermost conductive pattern CPa of the lower stack ST1 may have a fifth recess depth R3$a$, and the third contact plug CT3 coupled to the lowermost conductive pattern CPa of the lower stack ST1 may have a sixth recess depth R3$d$ less than the fifth recess depth R3$a$. The recess depths of the third contact plugs CT3 may vary monotonically depending on levels of the conductive patterns CPa of the lower stack ST1 and may be within a range between the fifth and six recess depths R3$a$ and R3$d$.

According to the embodiments of FIGS. 5 and 6, the recess depths of the contact plugs CT1, CT2, and CT3 may vary discontinuously between the upper and intermediate connection regions CNR1 and CNR2 and between the intermediate and lower connection regions CNR2 and CNR3.

A change amount DD2 of the recess depths of the second contact plugs CT2 on the intermediate connection region CNR2 may be less than a change amount DD1 of the recess depths of the first or third contact plugs CT1 or CT3 on the upper or lower connection region CNR1 or CNR3.

Figure 7:
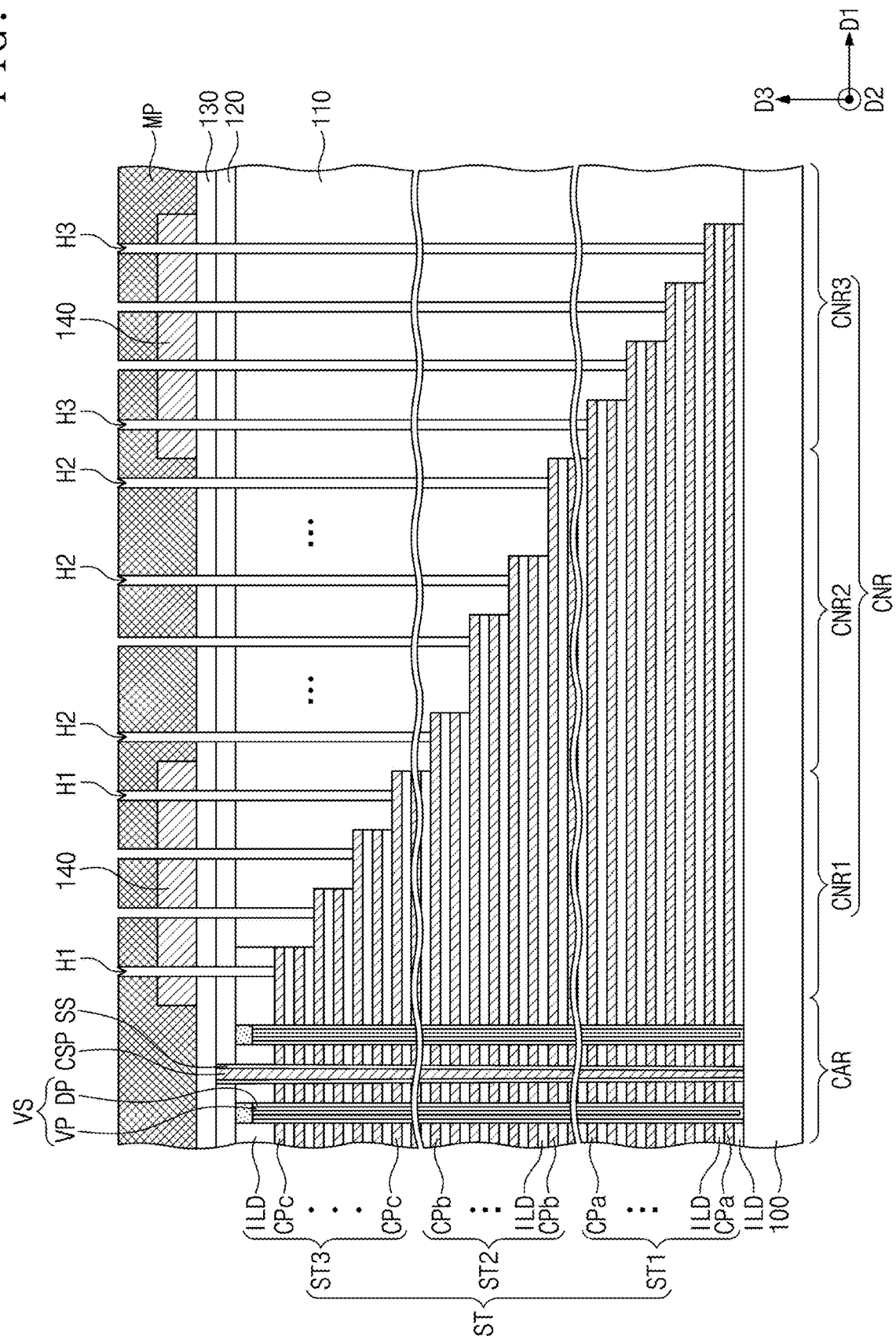
FIG. 7 is a sectional view illustrating a method of fabricating a three-dimensional semiconductor memory device according to some example embodiments of inventive concepts.
Figure 8:
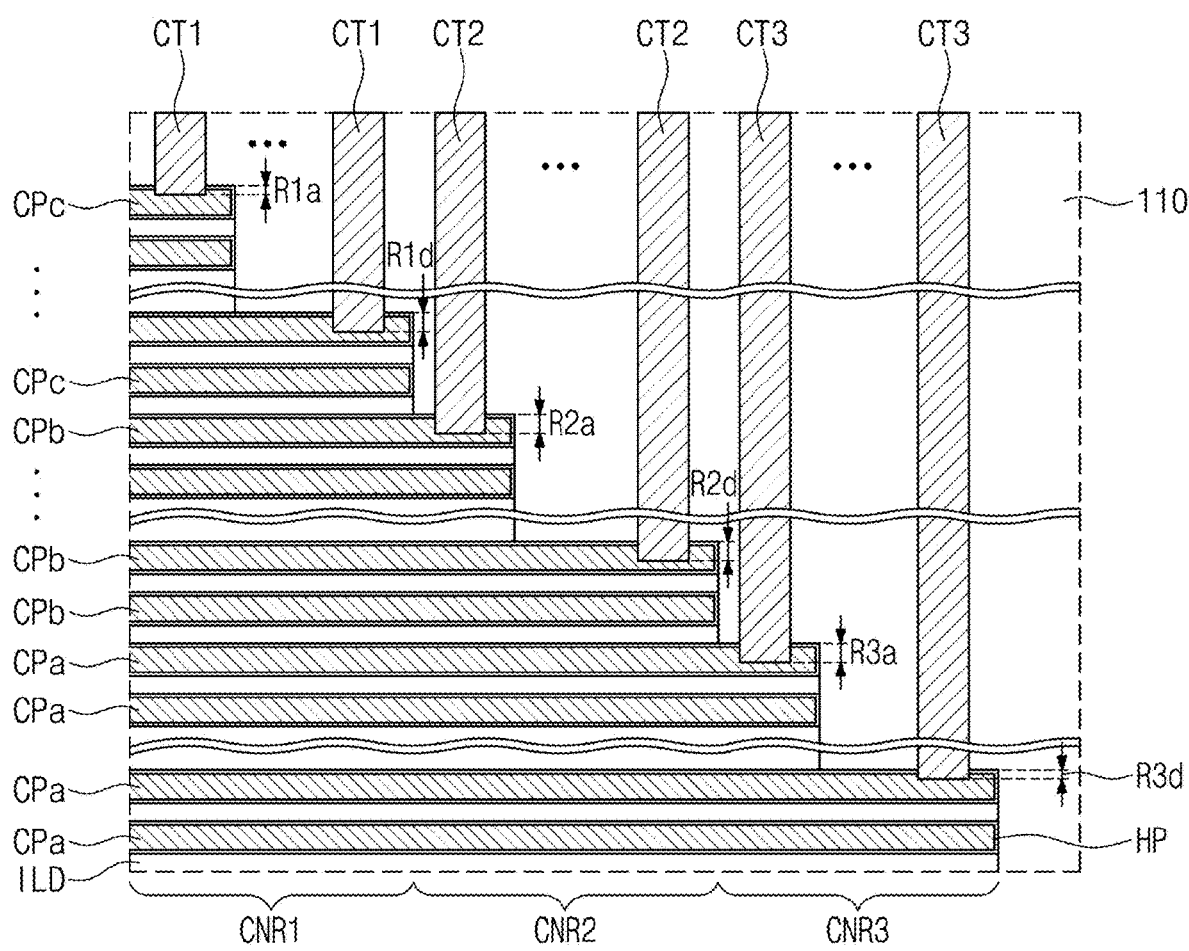
FIG. 8 is a sectional view illustrating a portion of a connection region of a three-dimensional semiconductor memory device fabricated by the fabrication method of FIG. 7.

FIG. 7 is a sectional view illustrating a method of fabricating a three-dimensional semiconductor memory device according to some example embodiments of inventive concepts. FIG. 8 is a sectional view illustrating a portion of a connection region of a three-dimensional semiconductor memory device fabricated by the fabrication method of FIG. 7. For concise description, elements previously described with reference to FIGS. 1A to 1G may be identified by the same reference number without repeating an overlapping description thereof.

Referring to FIG. 7, the connection region CNR of the substrate 100 may include a lower connection region CNR3, an upper connection region CNR1, and an intermediate connection region CNR2 therebetween.

The etch stop patterns 140 may be formed on, e.g. deposited and patterned on, a flat top surface of the second interlayered insulating layer 130 to be spaced apart from each other. Here, the etch stop patterns 140 may be formed on the upper and lower connection regions CNR1 and CNR3, respectively.

Similar to the method described with reference to FIGS. 1C and 1D, contact holes H1, H2, and H3 may be formed to penetrate the etch stop pattern 140, the first and second interlayered insulating layers 120 and 130, and the planarization insulating layer 110, after the formation of the etch stop pattern 140. Here, the first contact holes H1 may be formed to respectively expose the conductive patterns CPc of the upper stack ST3, the second contact holes H2 may be formed to respectively expose the conductive patterns CPb of the intermediate stack ST2, and the third contact holes H3 may be formed to respectively expose the conductive patterns CPa of the lower stack ST1.

In some example embodiments, when the first to third contact holes H1, H2, and H3 are simultaneously formed by the same process, there may be the etch stop pattern 140 on the intermediate connection region CNR2, and there may be the etch stop pattern 140 on each of the upper and lower connection regions CNR1 and CNR3. Thus, the recess depths of the first and third contact holes H1 and H3 on the upper and lower connection regions CNR1 and CNR3 may be less than the recess depths of the second contact holes H2.

As shown in FIG. 8, after the formation of the first to third contact holes H1, H2, and H3, first to third contact plugs CT1, CT2, and CT3 may be formed in the first to third contact holes H1, H2, and H3, respectively. The etch stop patterns 140 on the second interlayered insulating layer 130 may be removed, after the formation of the first to third contact plugs CT1, CT2, and CT3, as described above.

Referring to FIG. 8, a recess depth R1$d$ of the first contact plug CT1 coupled to the lowermost conductive pattern CPc of the upper stack ST3 may be less than a recess depth R2$a$ of the second contact plug CT2 coupled to the uppermost conductive pattern CPb of the intermediate stack ST2. A recess depth R2$d$ of the second contact plug CT2 coupled to the lowermost conductive pattern CPb of the intermediate stack ST2 may be greater than a recess depth R3$a$ of the third contact plug CT3 coupled to the uppermost conductive pattern CPa of the lower stack ST1.

Figure 9A:
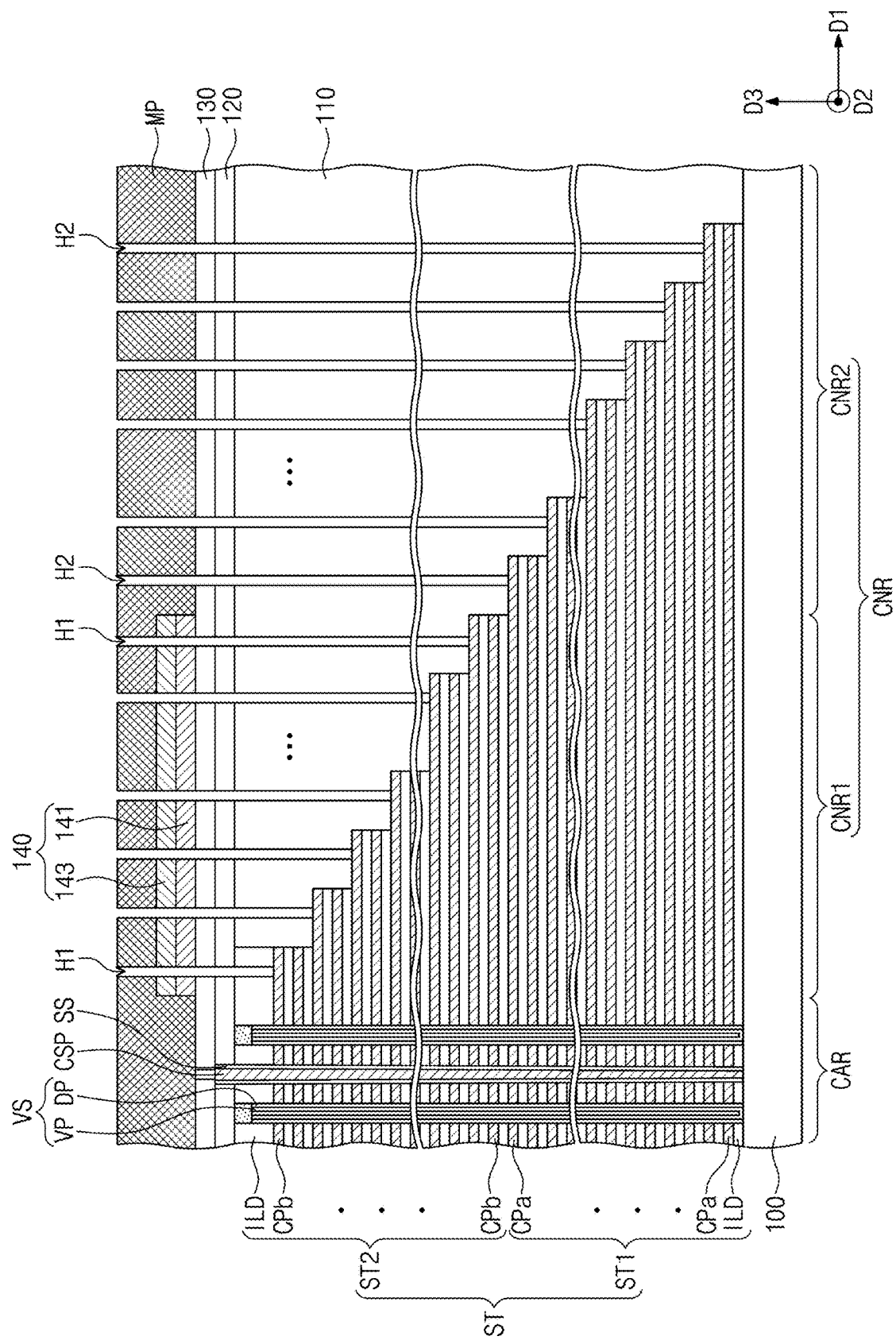
FIGS. 9A, 9B, and 9C are sectional views illustrating a method of fabricating three-dimensional semiconductor memory devices according to some embodiments of inventive concepts.
Figure 9B:
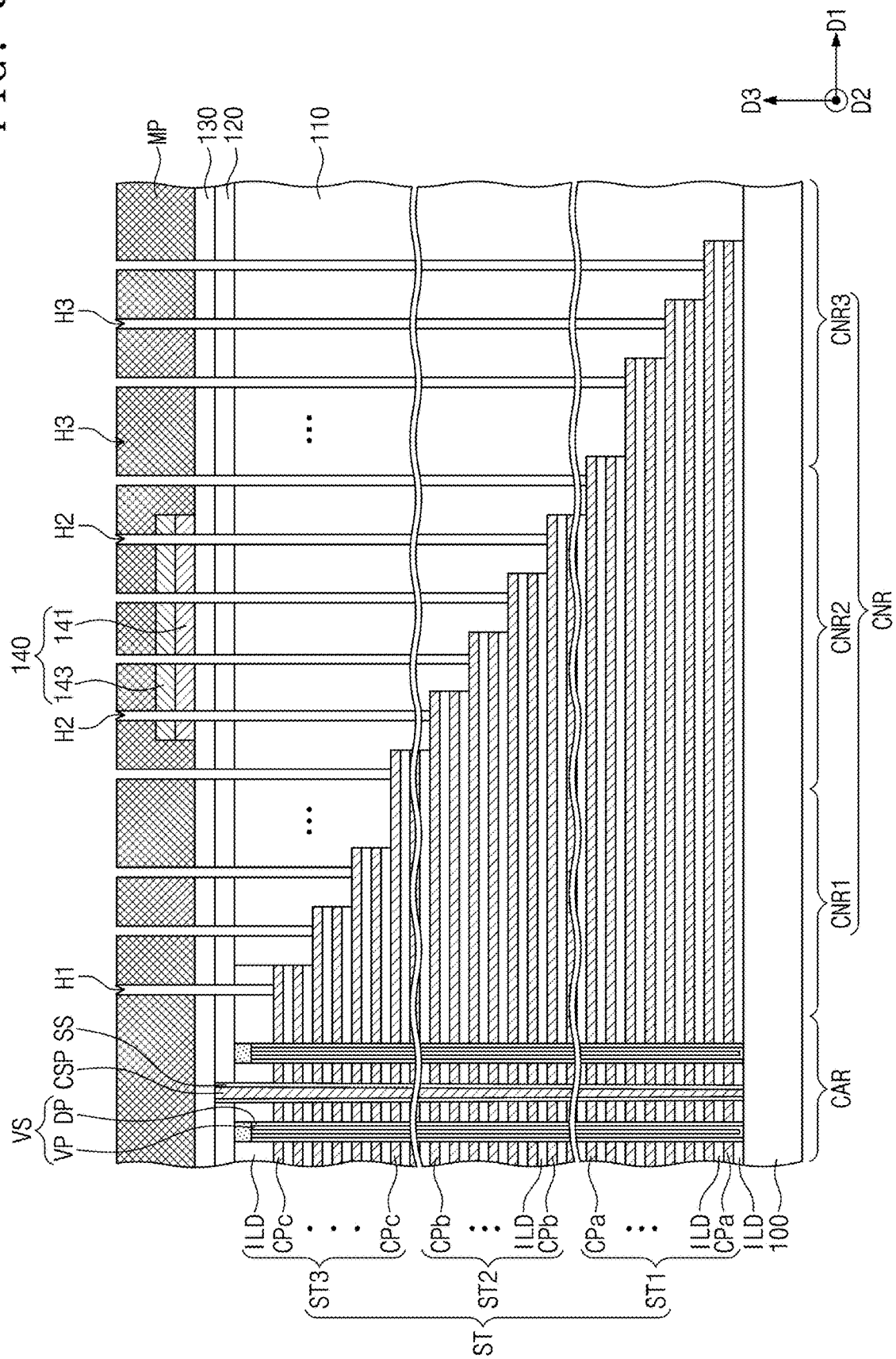
Figure 9C:
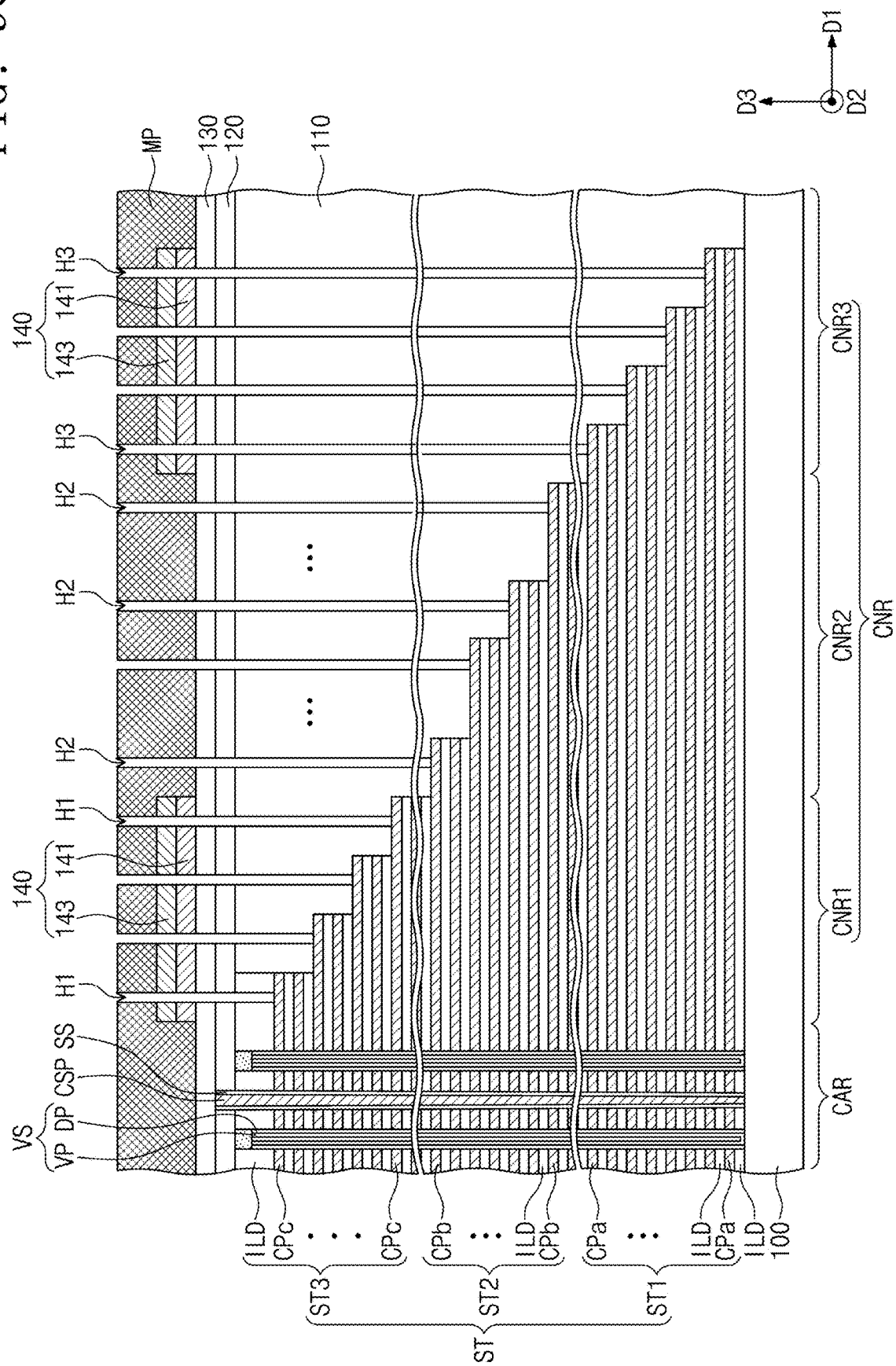

FIGS. 9A, 9B, and 9C are sectional views illustrating a method of fabricating three-dimensional semiconductor memory devices according to some embodiments of inventive concepts. For concise description, an element previously described with reference to FIGS. 1A to 1G may be identified by the same reference number without repeating an overlapping description thereof.

Referring to FIG. 9A, the etch stop pattern 140 may be formed on a portion of a flat top surface of the second interlayered insulating layer 130 located on the upper connection region CNR1. In some example embodiments, as shown in FIG. 9B, the etch stop pattern 140 may be formed on the intermediate connection region CNR2, and as shown in FIG. 9C, the etch stop patterns 140 may be formed on the upper and lower connection regions CNR1 and CNR3, respectively.

Referring to FIGS. 9A, 9B, and 9C, the etch stop pattern 140 may include lower and upper etch stop patterns 141 and 143, which are made of different materials. The lower and upper etch stop patterns 141 and 143 may have etch rates different from each other, in an anisotropic etching process. As an example, the lower etch stop pattern 141 may be formed of a conductive material, and the upper etch stop pattern 143 may be formed of an insulating material. As an example, the lower etch stop pattern 141 may etch faster than the upper etch stop pattern 143 during an anisotropic etch.

Figure 10A:
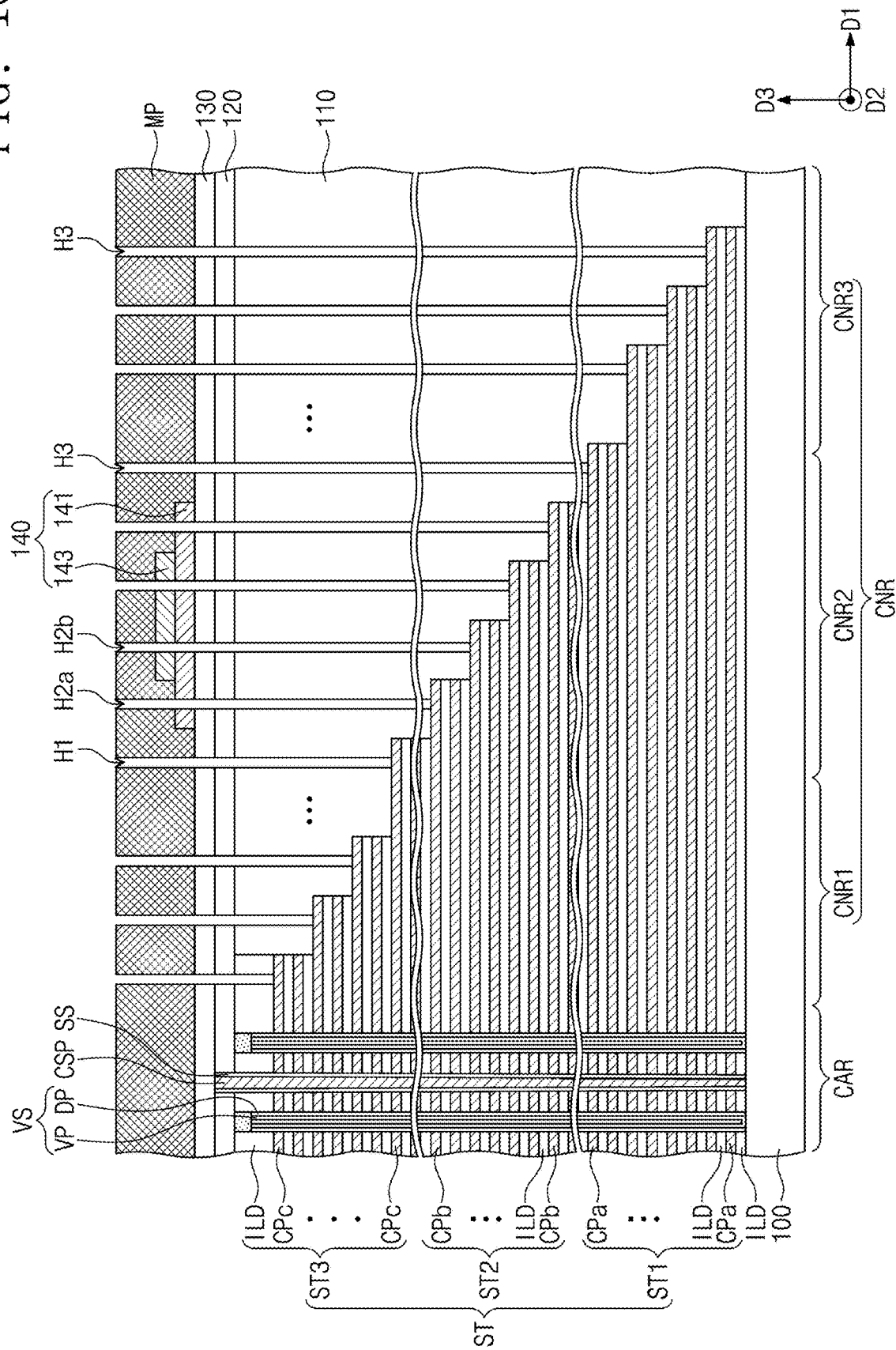
FIGS. 10A and 10B are sectional views illustrating a method of fabricating three-dimensional semiconductor memory devices according to some embodiments of inventive concepts.
Figure 10B:
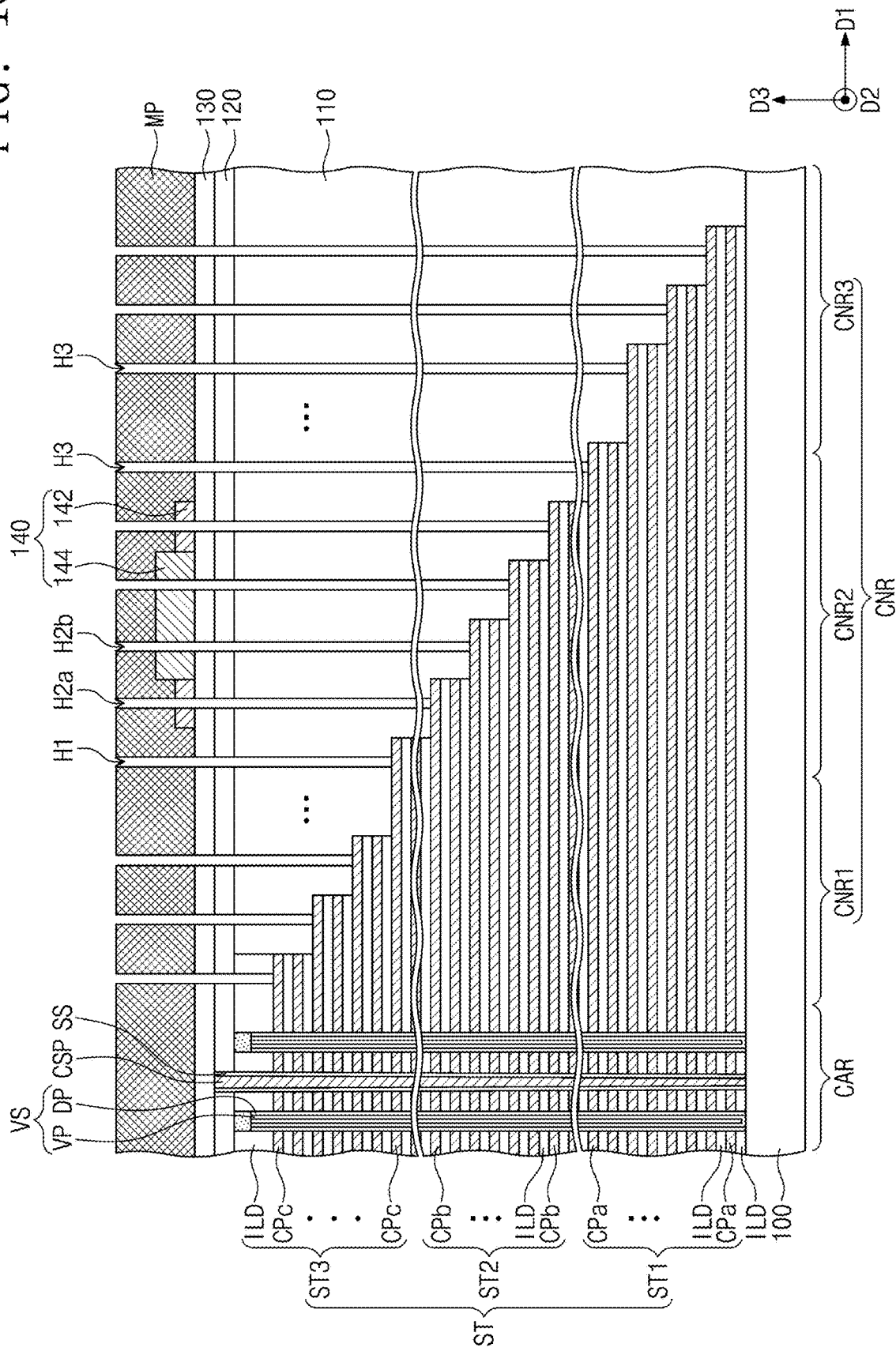
Figure 11:
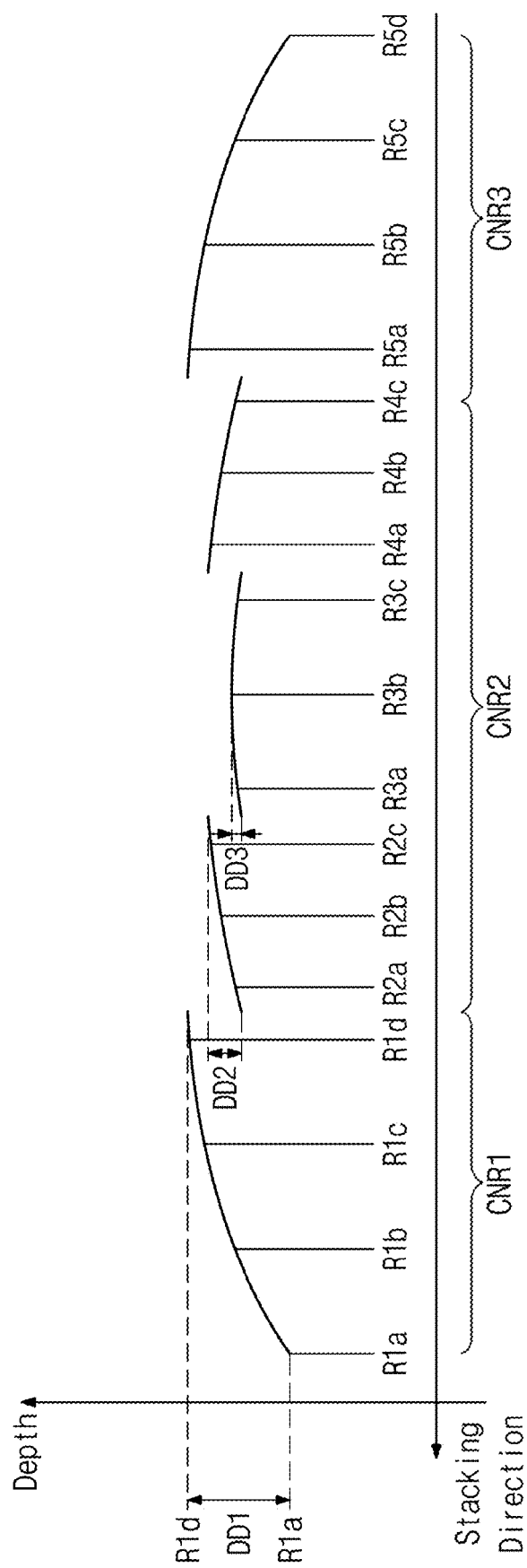
FIG. 11 is a graph showing a change in recess depth of contact plugs, which are provided in a three-dimensional semiconductor memory device fabricated by the fabrication method of FIGS. 10A and 10B.

FIGS. 10A and 10B are sectional views illustrating a method of fabricating three-dimensional semiconductor memory devices according to some embodiments of inventive concepts. FIG. 11 is a graph showing a change in recess depth of contact plugs, which are provided in a three-dimensional semiconductor memory device fabricated by the fabrication method of FIGS. 10A and 10B.

Referring to FIGS. 10A and 10B, the etch stop pattern 140 may be formed on a flat top surface of the second interlayered insulating layer 130, and the etch stop pattern 140 may include portions whose thicknesses and/or widths are different from each other.

For example, as shown in FIG. 10A, the etch stop pattern 140 may include a lower etch stop pattern 141, which has a first width, and an upper etch stop pattern 143, which is disposed on the lower etch stop pattern 141 and has a second width less than the first width. Here, the lower and upper etch stop patterns 141 and 143 may be formed of the same material or different materials.

Alternatively or additionally, as shown in FIG. 10B, the etch stop pattern 140 may include first etch stop patterns 142, which have a first thickness, and a second etch stop pattern 144, which has a second thickness larger than the first thickness. Here, the second etch stop pattern 144 may be disposed between the first etch stop patterns 142.

Similar to the method described with reference to FIGS. 1C and 1D, contact holes H1, H2a, H2b, and H3 may be formed to penetrate the etch stop pattern 140, the first and second interlayered insulating layers 120 and 130, and the planarization insulating layer 110, as shown in FIGS. 10A and 10B, after the formation of the etch stop pattern 140.

When the first to third contact holes H1, H2a, H2b, and H3 are formed at the same time, e.g. are anisotropically etched at the same time, there may be the etch stop pattern 140 on the intermediate connection region CNR2. Thus, the recess depths of the second contact holes H2a and H2b on the intermediate connection region CNR2 may be less than the recess depths of the first and third contact holes H1 and H3 on the lower and upper connection regions CNR1 and CNR3. Furthermore, since the etch stop pattern 140 on the intermediate connection region CNR2 have at least two different thicknesses, the recess depths of the second contact holes H2a and H2b may be different from each other.

Thereafter, the first to third contact plugs CT1, CT2, and CT3 may be formed in the first to third contact holes H1, H2a, H2b, and H3, respectively. The etch stop patterns 140 on the second interlayered insulating layer 130 may be removed, after the formation of the first to third contact plugs CT1, CT2, and CT3, as described above.

Referring to FIGS. 10A, 10B, and 11, the recess depths of the second contact plugs, which are formed in the second contact holes H2a and H2b penetrating a thick portion of the etch stop pattern 140, may be reduced, compared with those in a thin portion of the etch stop pattern 140. A change amount DD3 of the recess depths of the second contact plugs penetrating the thick portion of the etch stop pattern 140 may be less than a change amount DD2 of the recess depths of the second contact plugs penetrating the thin portion of the etch stop pattern 140.

FIGS. 12A, 12B, 12C, and 12D are sectional views illustrating a method of fabricating three-dimensional semiconductor memory devices according to some example embodiments of inventive concepts. For concise description, an element previously described with reference to FIGS. 1A to 1G may be identified by the same reference number without repeating an overlapping description thereof.

Figure 12A:
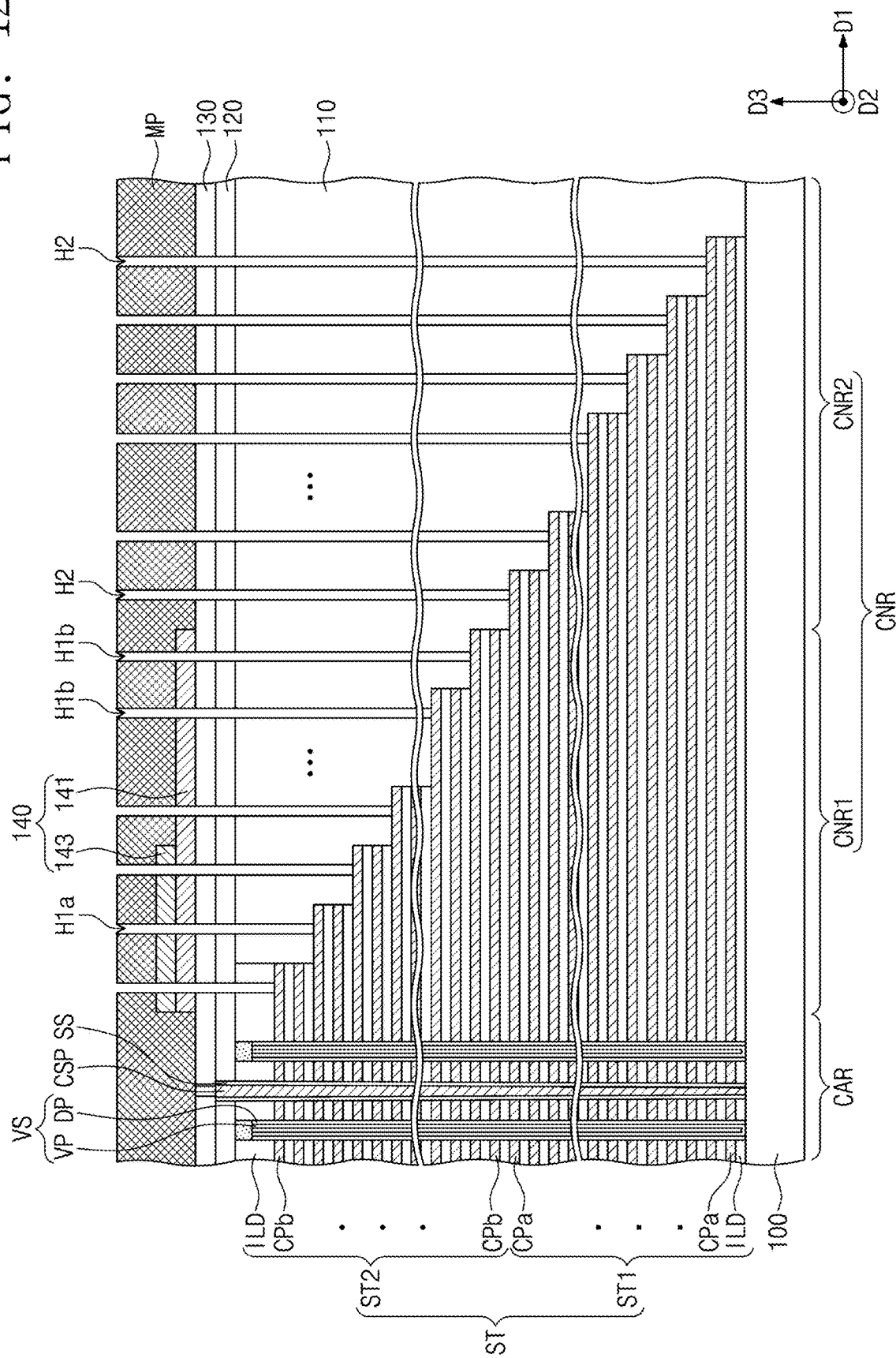
FIGS. 12A, 12B, 12C, and 12D are sectional views illustrating a method of fabricating three-dimensional semiconductor memory devices according to some embodiments of inventive concepts.
Figure 12B:
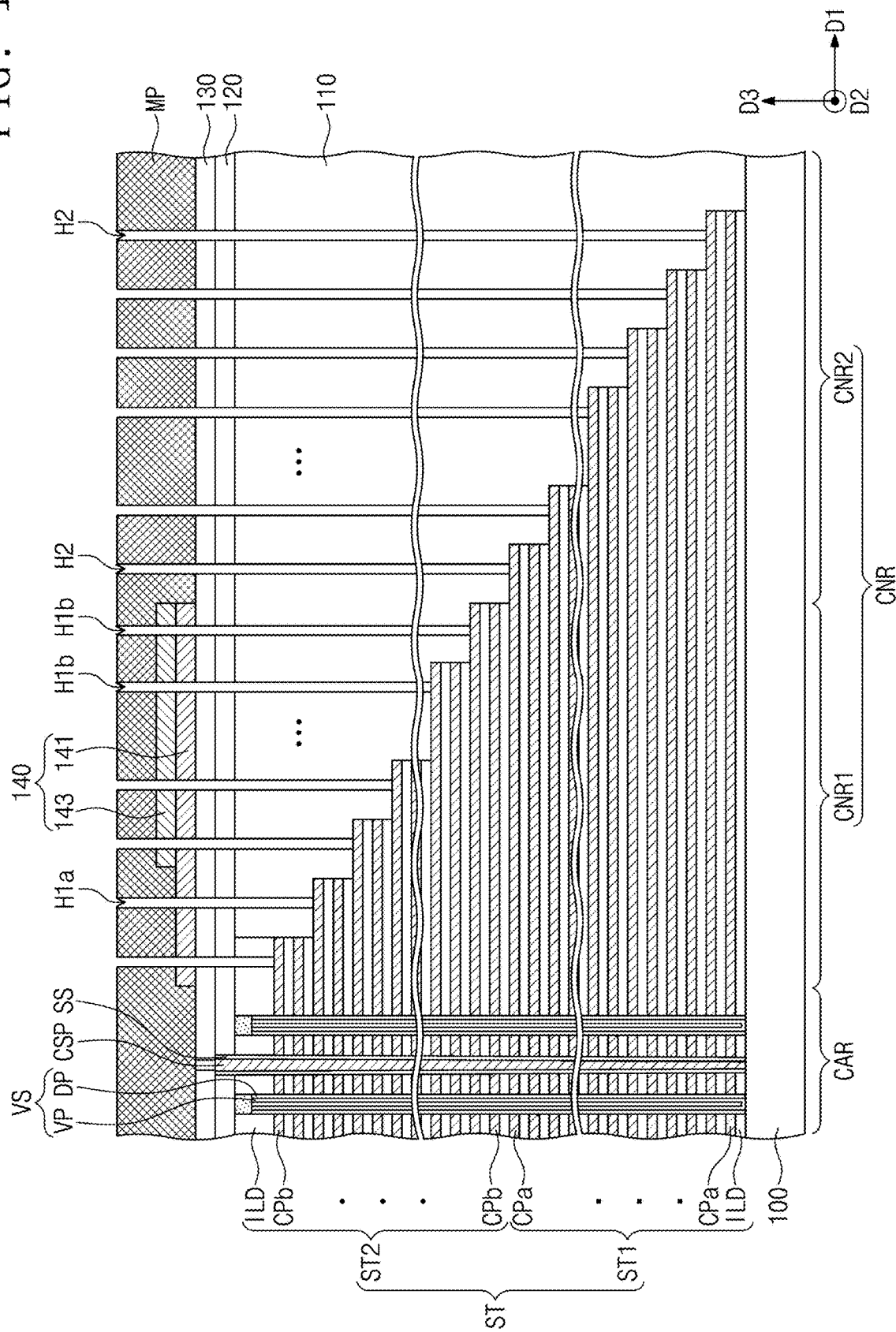

Referring to FIGS. 12A and 12B, the etch stop pattern 140 may be disposed on the upper connection region CNR1 and may include the lower etch stop pattern 141 having a first length and/or width and the upper etch stop pattern 143 having a second length and/or width less than the first length and/or width. The upper etch stop pattern 143 may be formed on the upper connection region CNR1 and locally on the lower etch stop pattern 141.

The first contact holes H1a and H1b may include the first contact holes H1a penetrating the lower and upper etch stop patterns 141 and 143 and the first contact holes H1b penetrating the lower etch stop pattern 141. When the first contact holes H1a and H1b are formed, the recess depths of the first contact plugs formed in the first contact holes H1a and H1b may be dependent on the thickness of the etch stop pattern 140.

Figure 12C:
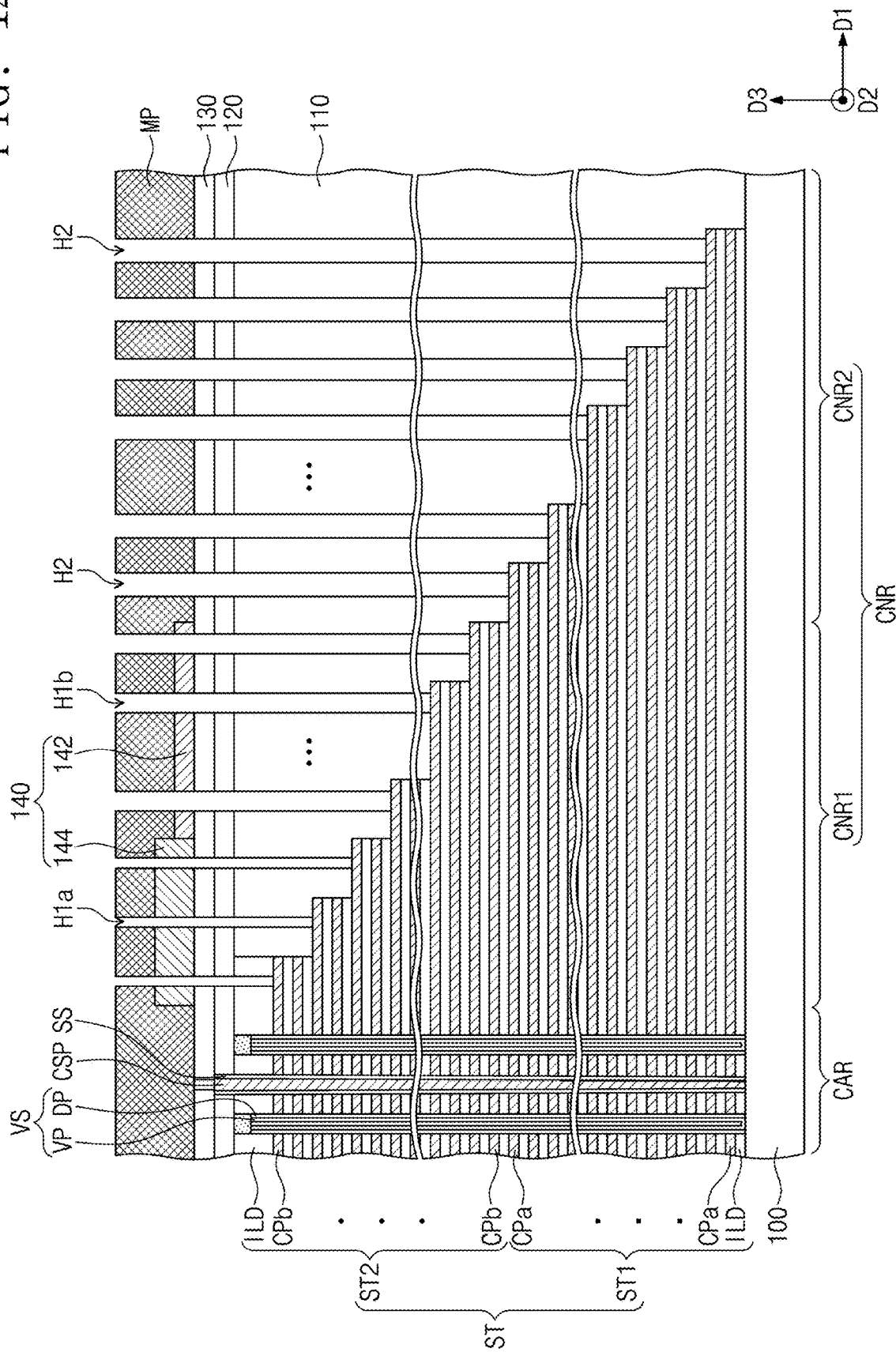

Referring to FIG. 12C, the etch stop pattern 140 may include the first etch stop patterns 142, which have a first thickness, and the second etch stop patterns 144, which have a second thickness greater than the first thickness. Since the etch stop pattern 140 on the upper connection region CNR1 is formed to have two different thicknesses, a diameter of the first contact hole H1b penetrating the first etch stop pattern 142 may be greater than a diameter of the first contact hole H1a penetrating the second etch stop pattern 144. Furthermore, the diameters of the second contact holes H2, which are formed on the lower connection region CNR2 without the etch stop pattern 140, may be greater than the diameter of the first contact hole H1b penetrating the second etch stop pattern 144.

Figure 12D:
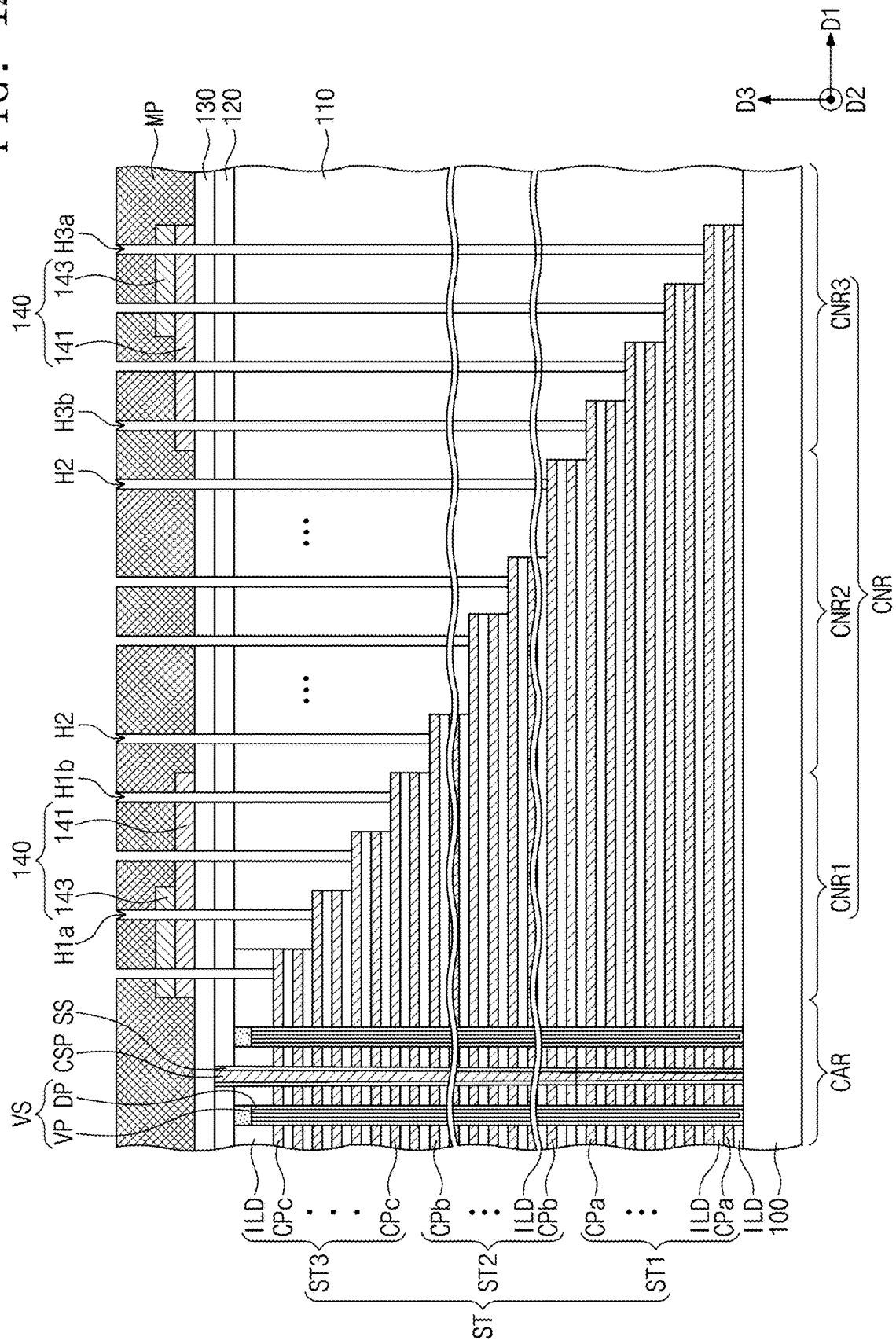

Referring to FIG. 12D, the etch stop patterns 140 may be formed on the upper and lower connection regions CNR1 and CNR3, respectively, and each of the etch stop patterns 140 may include the lower etch stop pattern 141 and the upper etch stop pattern 143 shorter than the lower etch stop pattern 141.

Figure 13:
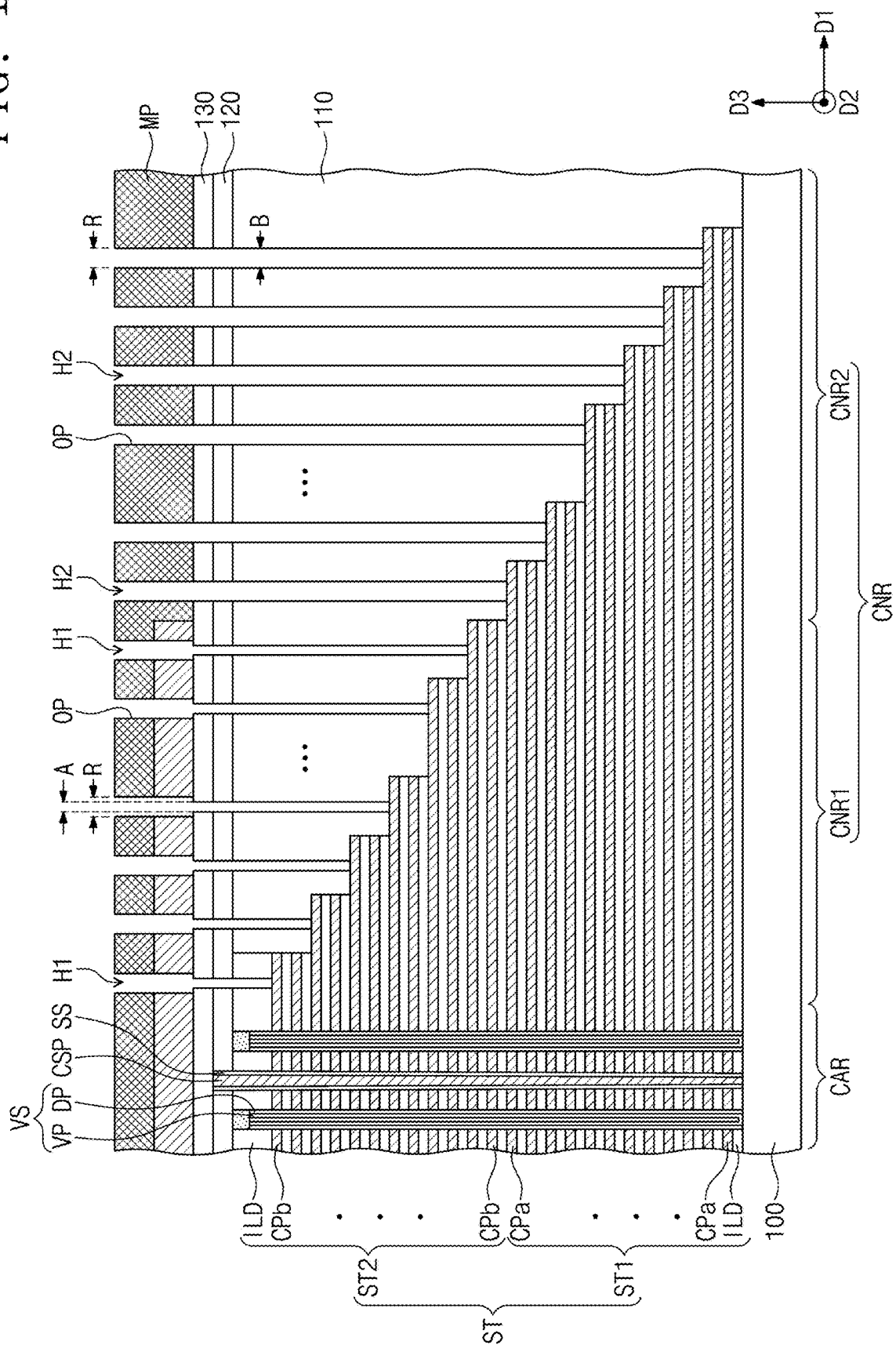
FIG. 13 is a sectional view illustrating a method of fabricating three-dimensional semiconductor memory devices according to some embodiments of inventive concepts.

FIG. 13 is a sectional view illustrating a method of fabricating three-dimensional semiconductor memory devices according to some embodiments of inventive concepts. For concise description, an element previously described with reference to FIGS. 1A to 1G may be identified by the same reference number without repeating an overlapping description thereof.

Referring to FIG. 13, the etch stop pattern 140 may be formed on a flat top surface of the second interlayered insulating layer 130, and then, the mask pattern MP with the openings OP may be formed on the etch stop pattern 140 and the second interlayered insulating layer 130, as previously described with reference to FIG. 1B. In some example embodiments, diameters R of the openings OP formed in the mask pattern MP may be substantially the same, regardless of the presence or absence of the etch stop pattern 140.

Thereafter, contact holes H1 and H2 may be formed to penetrate the etch stop pattern 140, the first and second interlayered insulating layers 120 and 130, and the planarization insulating layer 110, as previously described with reference to FIGS. 1C and 1D. Here, the contact holes H1 and H2 may include the first contact holes H1, which are formed to respectively expose the conductive patterns CPb of the upper stack ST2, and the second contact holes H2, which are formed to respectively expose the conductive patterns CPa of the lower stack ST1.

When the contact holes H1 and H2 are formed, an etch rate in the upper connection region CNR1 provided with the etch stop pattern 140 may be less than that in the lower connection region CNR2. Since the etch stop pattern 140 is formed of a material, which has an etch selectivity with respect to the first and second interlayered insulating layers 120 and 130 and the planarization insulating layer 110 when the first contact holes H1 are formed, a sidewall profile of the first contact hole H1 in the etch stop pattern 140 may be different from a sidewall profile of the first contact hole H1 in the first and second interlayered insulating layers 120 and 130 and the planarization insulating layer 110.

As an example, a diameter A of the first contact hole H1 may be less in the planarization insulating layer 110 than in the etch stop pattern 140.

The second contact holes H2, which are formed on the lower connection region CNR2 without the etch stop pattern 140, may have a substantially uniform sidewall profile. A difference between an upper diameter B of the second contact hole H2 and the diameter R of the opening OP of the mask pattern MP may be less than a difference between the upper diameter A of the first contact hole H1 and the diameter R of the opening OP of the mask pattern MP.

Thereafter, as described above, the first and second contact plugs CT1 and CT2 may be formed in the first and second contact holes H1 and H2, respectively, and then, the etch stop pattern 140 may be removed. The first and second contact plugs CT1 and CT2 formed by the afore-described method, may have different diameters from each other, at their top level. As an example, the diameters of the first contact plugs CT1 coupled to the conductive patterns CPb of the upper stack ST2 may be less than the diameters of the second contact plugs CT2 coupled to the conductive patterns CPa of the lower stack ST1. The difference in diameter between the first and second contact plugs CT1 and CT2 may range from about 5 nm to 10 nm.

Figure 14A:
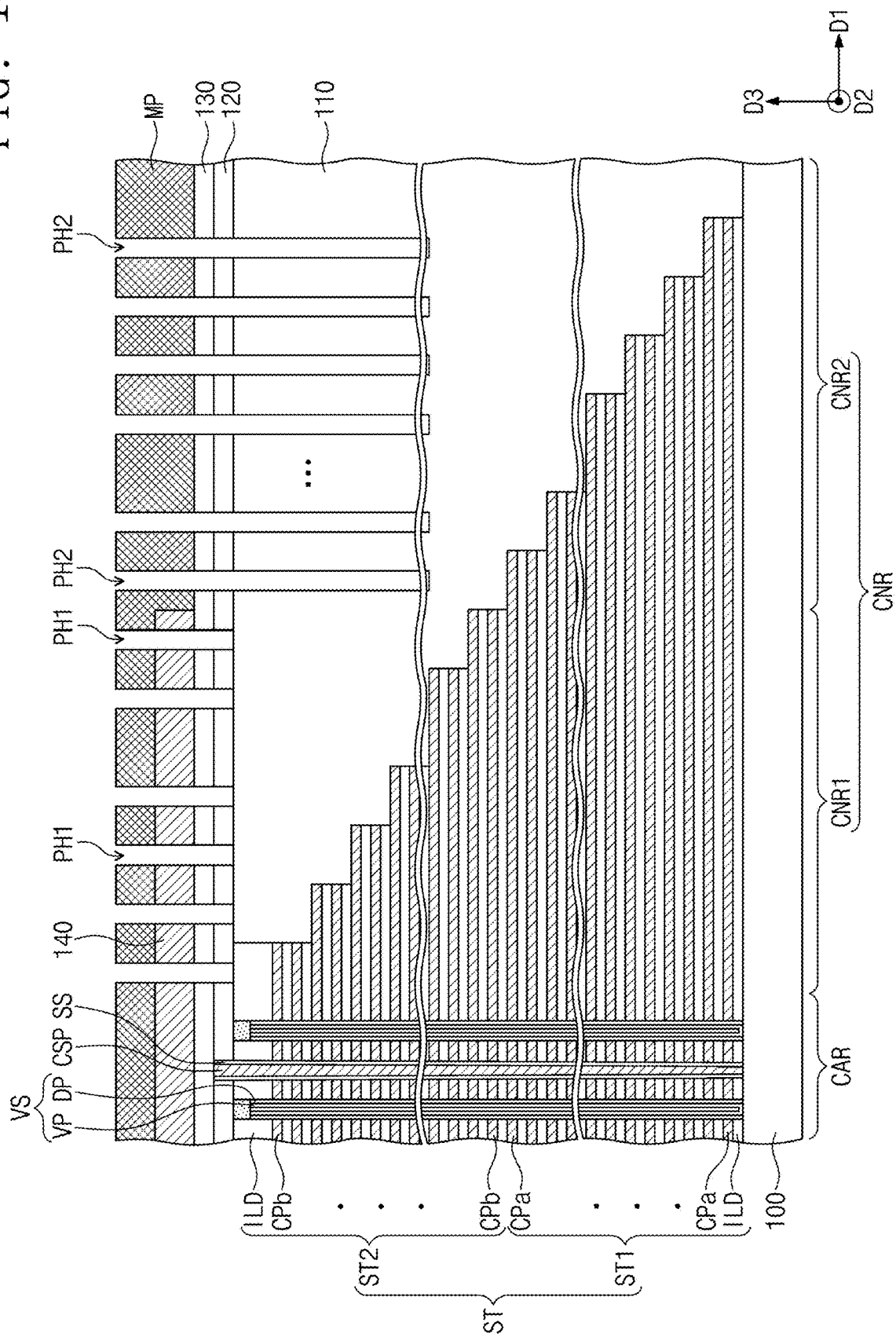
FIGS. 14A and 14B are sectional views illustrating a method of fabricating three-dimensional semiconductor memory devices according to some embodiments of inventive concepts.
Figure 14B:
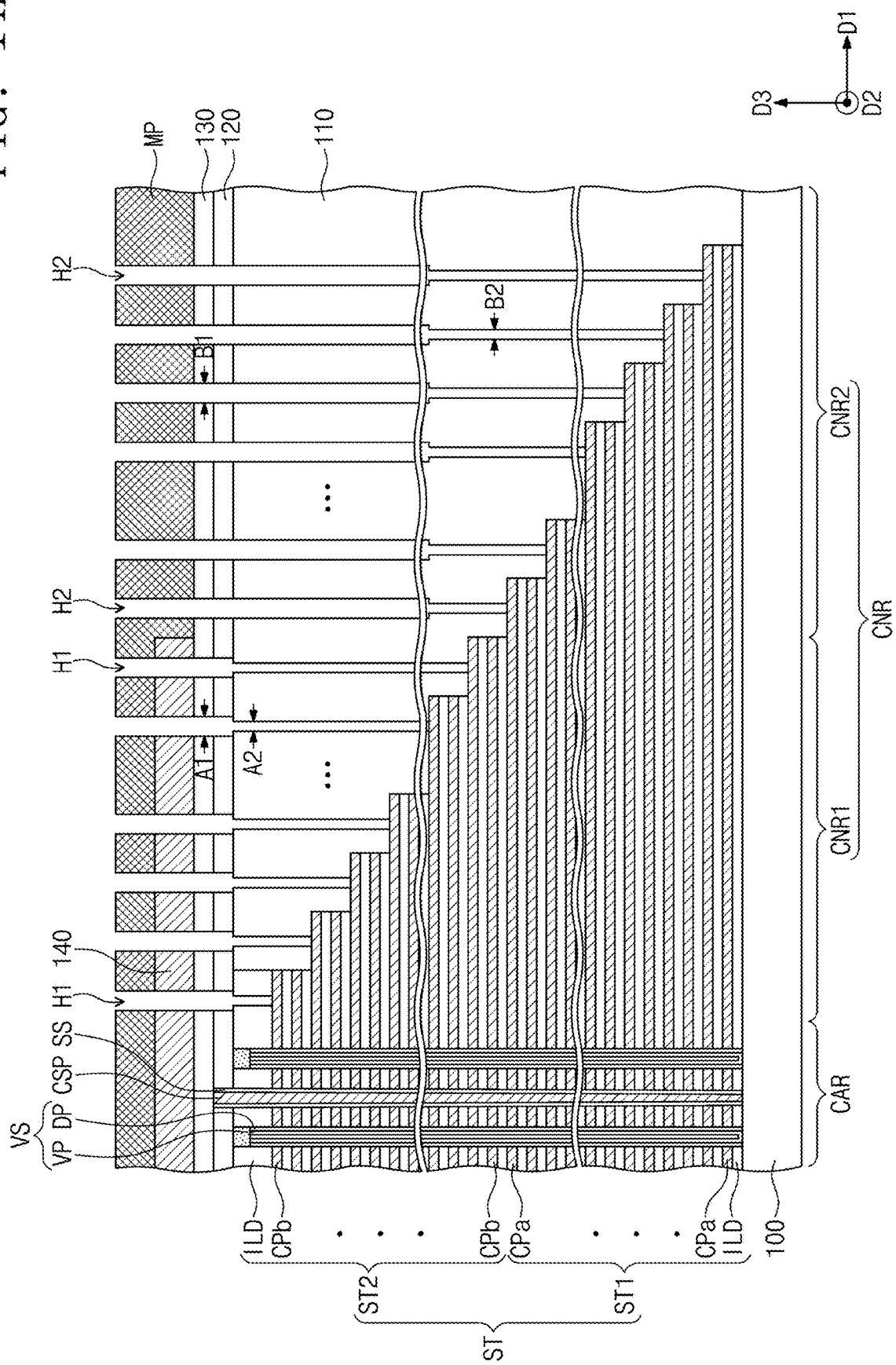

FIGS. 14A and 14B are sectional views illustrating a method of fabricating three-dimensional semiconductor memory devices according to some embodiments of inventive concepts. For concise description, an element previously described with reference to FIGS. 1A to 1G may be identified by the same reference number without repeating an overlapping description thereof.

Referring to FIG. 14A, the etch stop pattern 140 may be formed on a flat top surface of the second interlayered insulating layer 130, and then, the mask pattern MP with openings may be formed on the etch stop pattern 140 and the second interlayered insulating layer 130, as previously described with reference to FIG. 1B. In some example embodiments, diameters of the openings of the mask pattern MP may be substantially the same, regardless of the presence or absence of the etch stop pattern 140.

Thereafter, the first anisotropic etching process may be performed to form the first preliminary contact holes PH1, which penetrate the etch stop pattern 140, and the second preliminary contact holes PH2, which are spaced apart from the etch stop pattern 140 and penetrate the first and second interlayered insulating layers 120 and 130 and a portion of the planarization insulating layer 110, as previously described with reference to FIG. 1C. The first and second preliminary contact holes PH1 and PH2 may be formed at the same time, but lengths of the first preliminary contact holes PH1 may be greater than lengths of the second preliminary contact holes PH2.

Thereafter, referring to FIG. 14B, the second anisotropic etching process may be performed on the planarization insulating layer 110 exposed through the first and second preliminary contact holes PH1 and PH2. An etch recipe, which is different from that in the first anisotropic etching process, may be used in the second anisotropic etching process. Thus, sidewall profiles of the first and second contact holes H1 and H2 exposing end portions of the conductive patterns CPa and CPb may vary discontinuously, after the formation of the first and second preliminary contact holes PH1 and PH2.

As an example, the first and second contact holes H1 and H2 may have first diameters A1 and B1, respectively, at their top levels and may have second diameters A2 and B2, respectively, which are smaller than the first diameters A1 and B1, at their bottom level. A sidewall profile of each of the first and second contact holes H1 and H2 may have an inflection point, at which a width or slope is discontinuously changed. For example, a difference between sidewall profiles of adjacent ones of the first and second contact holes H1 and H2 may be significantly different than a difference between sidewall profiles of adjacent ones of the first contact holes H1, or a difference between sidewall profiles of adjacent ones of the second contact holes H2. Furthermore, the first and second contact holes H1 and H2 may differ from each other in terms of vertical lengths of upper portions with the first diameters A1 and B1.

Figure 15:
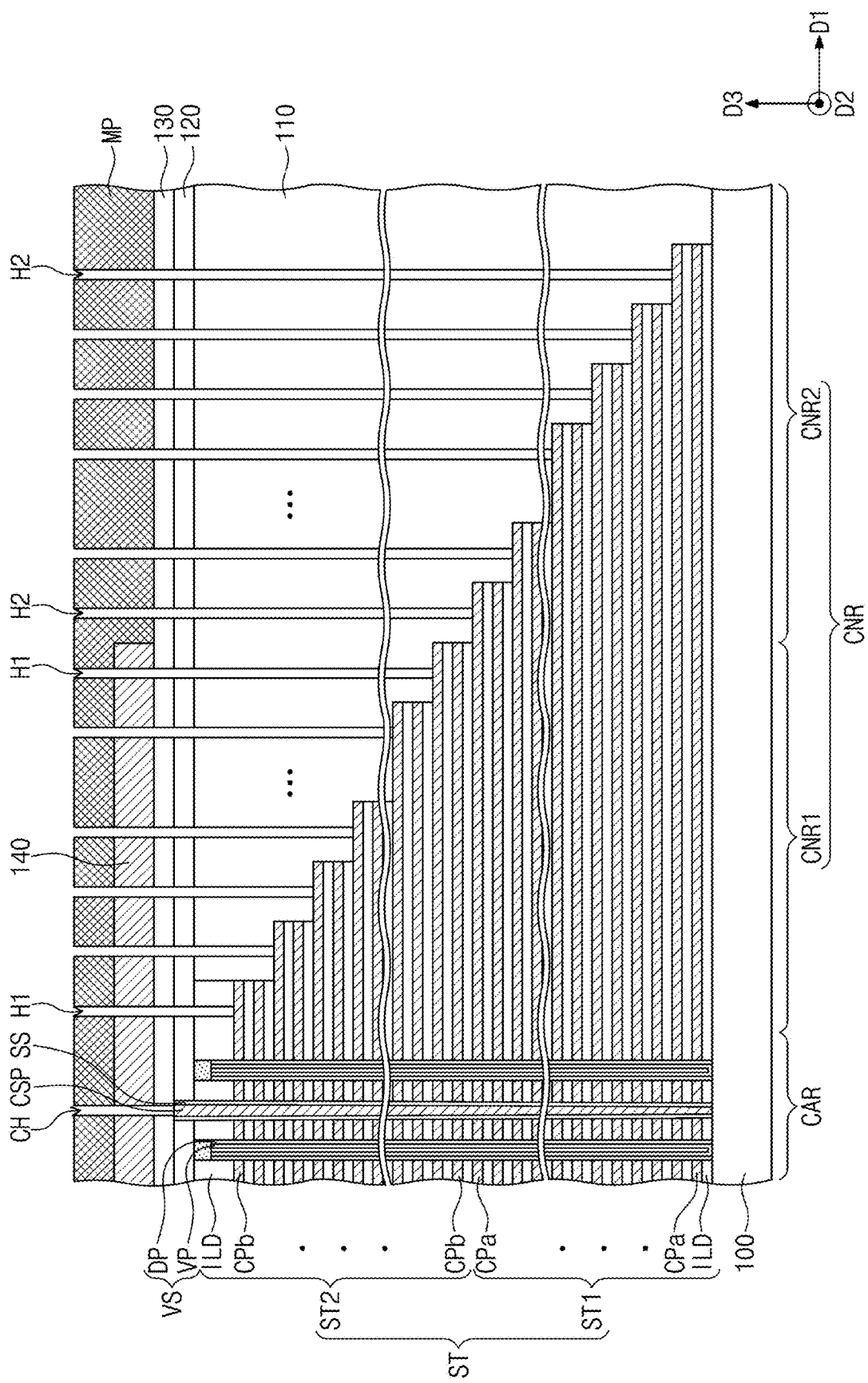

FIGS. 15 and 16 are sectional views illustrating a method of fabricating three-dimensional semiconductor memory devices according to some embodiments of inventive concepts. For concise description, an element previously described with reference to FIGS. 1A to 1G may be identified by the same reference number without repeating an overlapping description thereof.

Referring to FIG. 15, the etch stop pattern 140 may be extended from the upper connection region CNR1 to the cell array region CAR. After the formation of the etch stop pattern 140, the contact holes H1 and H2 may be formed to penetrate the etch stop pattern 140, the first and second interlayered insulating layers 120 and 130, and the planarization insulating layer 110, as described with reference to FIGS. 1C and 1D, and in some example embodiments, a cell contact hole CH may be formed on the cell array region CAR, when the contact holes H1 and H2 are formed. As an example, the cell contact hole CH may be formed to expose the common source conductive pattern CSP.

Referring to FIG. 16, the substrate 100 may include the cell array region CAR, the connection region CNR, and a peripheral circuit region PCR.

Peripheral transistors PT may be formed on the peripheral circuit region PCR of the substrate 100, before or after forming the stack ST on the substrate 100, and the planarization insulating layer 110 and the first and second interlayered insulating layers 120 and 130 may be formed to cover the peripheral transistors PT.

In some example embodiments, during forming the contact holes H1 and H2 exposing the conductive patterns CPa and CPb of the stack ST, the cell contact holes CH on the cell array region CAR and peripheral contact holes PH on the peripheral circuit region PCR may be formed, e.g. may be etched, at the same time.

According to some example embodiments of inventive concepts, it may be possible to form contact plugs, which are respectively coupled to conductive patterns, at the same time, while preventing or reducing the likelihood of an etch stop pattern from being left on a staircase structure of a stack.

While example embodiments of inventive concepts have been particularly shown and described, it will be understood by one of ordinary skill in the art that variations in form and detail may be made therein without departing from the spirit and scope of the attached claims.

What is claimed is:

1. A three-dimensional semiconductor memory device, comprising:
a substrate including a cell array region and a connection region;
a stack including a first stack and a second stack, the first stack and the second stack sequentially stacked on the substrate, the stack having a staircase structure on the connection region, a number of steps of the staircase decreasing in a first direction, each of the first and second stacks comprising conductive patterns vertically stacked on the substrate; and
contact plugs on the connection region and respectively coupled to the conductive patterns of the first and second stacks,
wherein a bottom surface of each of the contact plugs is between top and bottom surfaces of a corresponding one of the conductive patterns,
in the first stack, recess depths of neighboring ones of the contact plugs varies monotonically in the first direction, the recess depths measured from a top surface of a corresponding one of the conductive patterns,
in the second stack, recess depths of neighboring ones of the contact plugs varies monotonically in the first direction, the recess depths measured from a top surface of a corresponding one of the conductive patterns, and
recess depths vary to have an inflection between contacts neighboring one another in the first and second stack.

2. The device of claim 1, wherein the contact plugs comprise a first contact plug, which is coupled to an uppermost conductive pattern of the first stack, and a second contact plug, which is coupled to a lowermost conductive pattern of the second stack, and
in each of the first and second stacks, a first difference in recess depth between each of adjacent ones of the contact plugs is less than a second difference in recess depth between the first and second contact plugs.

3. The device of claim 2, wherein the first difference ranges from 0.5 nm to 5 nm, and the second difference ranges from 3 nm to 10 nm.

4. The device of claim 1, wherein the recess depths of the contact plugs ranges from 5 nm to 35 nm.

5. The device of claim 1, wherein a first total change in a recess depth of the contact plugs on the first stack is different from a second total change in a recess depth of the contact plugs on the second stack,
the first total change corresponding to a difference between largest and smallest values of the recess depths of the contact plugs on the first stack, and
the second total change corresponding to difference between largest and smallest values of the recess depths of the contact plugs on the second stack.

6. The device of claim 5, wherein the second total change is less than the first total change.

7. The device of claim 1, wherein the contact plugs comprise:
a plurality of first contact plugs, which are on the connection region and are respectively coupled to the conductive patterns of the first stack, recess depths of the first contact plugs varying monotonically in the first direction; and
a plurality of second contact plugs, which are on the connection region and are respectively coupled to the conductive patterns of the second stack, recess depths of the second contact plugs varying monotonically in the first direction,
wherein recess depths of adjacent ones of the first and second contact plugs do not vary in the same monotonic manner as recess depths of the first contact plugs vary monotonically.

8. The device of claim 7, wherein a bottom surface of a first one of the first contact plugs that is coupled to an uppermost conductive pattern of the first stack is at a first recess depth from a top surface of the uppermost conductive pattern of the first stack, and
a bottom surface of a first one of the second contact plugs that is coupled to a lowermost conductive pattern of the second stack is at a second recess depth from a top surface of the lowermost conductive pattern of the second stack, the second recess depth less than the first recess depth.

9. The device of claim 8, wherein a bottom surface of a second one of the first contact plugs that is coupled to a lowermost conductive pattern of the first stack is at a third recess depth from a top surface of the lowermost conductive pattern of the first stack, the third recess depth less than the first recess depth,
a bottom surface of a second one of the second contact plugs that is coupled to an uppermost conductive pattern of the second stack is at a fourth recess depth from a top surface of the uppermost conductive pattern of the second stack, the fourth recess depth less than the second recess depth,
a first total change in a recess depth of the contact plugs on the first stack is different from a second total change amount in a recess depth of the contact plugs on the second stack,
the first total change corresponding to a difference between the first recess depth and the third recess depth, and
the second total change corresponding to a difference between the second recess depth and the fourth recess depth.

10. The device of claim 7, wherein the first contact plugs have a first average upper diameter, and the second contact plugs have a second average upper diameter different from the first average upper diameter.

11. The device of claim 7, wherein each of the first and second contact plugs comprises an upper portion having a first diameter and a lower portion having a second diameter different from the first diameter,
a sidewall profile of each of the first and second contact plugs has a varying slope and an inflection point which is located at a border between the upper and lower portions, and
a height of the upper portion of the first contact plug is different from a height of the upper portion of the second contact plug.

12. The device of claim 1, further comprising:
a planarization insulating layer covering the staircase structure of the stack; and
a horizontal blocking insulating layer covering top and bottom surfaces of each of the conductive patterns,
wherein, on the connection region, portions of the horizontal blocking insulating layer are in direct contact with the planarization insulating layer.

13. The device of claim 12, wherein the planarization insulating layer has a flat top surface on the cell array region and the connection region and has a decrease in thickness in a direction from the connection region to the cell array region.

14. The device of claim 1, wherein the stack further comprises a third stack including third conductive patterns vertically stacked on the second stack,
the contact plugs further comprise upper contact plugs, which are on the connection region and are coupled to the third conductive patterns, respectively,
a recess depth of each of the upper contact plugs varies monotonically in the first direction, when measured from a top surface of a corresponding one of the third conductive patterns,
a first total change in a recess depth of the contact plugs on the first stack is different from a total second change in a recess depth of the contact plugs on the second stack,
the second total change is less than the first total change and a third total change in a recess depth of the upper contact plugs,
the first total change corresponding to difference between largest and smallest values of the recess depths of the contact plugs on the first stack,
the second total change corresponding to between largest and smallest values of the recess depths of the contact plugs on the second stack, and
the third total change corresponds to a difference between largest and smallest values of the recess depths of the contact plugs on the third stack.

15. A three-dimensional semiconductor memory device, comprising:
a substrate including a cell array region and a connection region;
a stack including a first stack and a second stack sequentially stacked on the substrate, the stack having a staircase structure on the connection region, each of the first and second stacks comprising insulating patterns and conductive patterns, which are vertically and alternately stacked on the substrate;
a planarization insulating layer covering the staircase structure of the stack and having a substantially flat top surface, portions of the insulating patterns being in direct contact with the planarization insulating layer;
first contact plugs, which are on the connection region and penetrate the planarization insulating layer and are respectively coupled to the conductive patterns of the first stack; and
second contact plugs, which are on the connection region and are respectively coupled to the conductive patterns of the second stack,
wherein a bottom surface of each of the first and second contact plugs is located between top and bottom surfaces of a corresponding one of the conductive patterns,
a recess depth of each of the first contact plugs varies monotonically in a stacking direction of the conductive patterns, the recess depth measured from a top surface of a corresponding one of the conductive patterns of the first stack,
a recess depth of each of the second contact plugs varies monotonically in a stacking direction of the conductive patterns, the recess depth measured from a top surface of a corresponding one of the conductive patterns of the second stack, and
recess depths of adjacent ones of the first and second contact plugs vary to have an inflection, the recess depths of adjacent ones of the first and second contact plugs measured from a top surface of a corresponding one of the conductive patterns.

16. The device of claim 15, wherein a first difference between the recess depths of adjacent ones of the first contact plugs is less than a second difference between the recess depths of adjacent ones of the first and second contact plugs.

17. A three-dimensional semiconductor memory device, comprising:
a substrate including a cell array region and a connection region;
a stack including first, second, and third stacks sequentially stacked on the substrate, the stack having a staircase structure on the connection region, each of the first, second, and third stacks comprising insulating patterns and conductive patterns vertically and alternately stacked on the substrate; and
contact plugs coupled to the conductive patterns of the stack, respectively,
wherein a bottom surface of each of the contact plugs is between top and bottom surfaces of a corresponding one of the conductive patterns,
the contact plugs comprise,
a first contact plug coupled to an uppermost conductive pattern of the first stack,
a second contact plug coupled to a lowermost conductive pattern of the first stack,
a third contact plug coupled to an uppermost conductive pattern of the second stack,
a fourth contact plug coupled to a lowermost conductive pattern of the second stack,
a fifth contact plug coupled to an uppermost conductive pattern of the third stack, and
a sixth contact plug coupled to a lowermost conductive pattern of the third stack, and
a difference between recess depths of the bottom surfaces of the third and fourth contact plugs is less than a difference between recess depths of the bottom surfaces of the first and second contact plugs or between recess depths of the bottom surfaces of the fifth and sixth contact plugs, where each of the recess depths is measured from a top surface of a corresponding one of the conductive patterns.

18. The device of claim 17, wherein the recess depths of the bottom surfaces of the contact plugs is between 0.1 to 0.9 times a thickness of a corresponding one of the conductive patterns.

19. The device of claim 17, wherein the third and fourth contact plugs have a first average upper diameter, and the first and second contact plugs have a second average upper diameter greater than the first upper diameter.

20. The device of claim 19, wherein a difference between the first upper diameter and the second upper diameter ranges from 5 nm to 10 nm.

* * * * *